US007859344B2

(12) United States Patent
Uozumi et al.

(10) Patent No.: US 7,859,344 B2
(45) Date of Patent: Dec. 28, 2010

(54) PLL CIRCUIT WITH IMPROVED PHASE DIFFERENCE DETECTION

(75) Inventors: Toshiya Uozumi, Tokyo (JP); Keisuke Ueda, Tokyo (JP); Mitsunori Samata, Tokyo (JP); Satoru Yamamoto, Tokyo (JP); Russell P Mohn, Tarrytown, NY (US); Aleksander Dec, Tarrytown, NY (US); Ken Suyama, Tarrytown, NY (US)

(73) Assignees: Renesas Electronics Corporation, Kanagawa (JP); Epoch Microelectronics, Inc., Tarrytown, NY (US)

( * ) Notice: Subject to any disclaimer, the term of this patent is extended or adjusted under 35 U.S.C. 154(b) by 289 days.

(21) Appl. No.: 12/111,458

(22) Filed: Apr. 29, 2008

(65) Prior Publication Data

US 2009/0267664 A1 Oct. 29, 2009

(51) Int. Cl.
*H03L 7/00* (2006.01)
(52) U.S. Cl. .......................... 331/1 A; 331/25; 331/34; 331/177 R; 327/156; 375/376
(58) Field of Classification Search ................ 331/1 A, 331/25, 34, 177 R; 327/156, 159; 375/376
See application file for complete search history.

(56) References Cited

U.S. PATENT DOCUMENTS 7,123,102 B2   10/2006  Uozumi et al. .................. 331/34

7,425,874 B2 *   9/2008  Risbo et al. .................. 331/1 A
2005/0116258 A1   6/2005  Yamagishi et al. .......... 257/222

OTHER PUBLICATIONS

ISSCC 2004/Session 26/Optical and Fast I/O /26.10, Lin, et al., "A PVT Tolerant O.18MHz to 600 MHz Self-Calibrated Digital PLL in 90nm CMOS Process".
IEEE Journal of Solid-State Circuits, vol. 39, No. 5, May 2004, "A Digitally Controlled PLL for SoC Applications" Olson, et al.
IEEE Journal of Solid-State Circuits, vol. 38, No. 2, Feb. 2003, "An ALL-Digital PLL for Frequency Multiplication by 4 to 1022 With Seven-Cycle Lock Time" by Watanabe, et al.
IEEE Transactions on Circuits and Systems-II: Analog and Digital Signal Processing, vol. 41, No. 5, May 1994., "A Simplified Continuous Phase Modulator Technique" T. Riley, et al.

* cited by examiner

*Primary Examiner*—Arnold Kinkead
(74) *Attorney, Agent, or Firm*—Mattingly & Malur, P.C.

(57) ABSTRACT

In an ADPLL composed of a digital circuit, a technique improving phase difference detection in a vicinity of a phase difference of 0 (zero) is provided. A feedback loop comprises a PFD comparing phases and frequencies of a reference signal and a feedback signal, a TDC converting an output of the PFD into a digital value, a DLF removing a high frequency noise component from an output of the TDC, a DCO controlled based on an output of the DLF and a DIV frequency-dividing an output the DCO and outputting the feedback signal. An offset value is added at any portion of the feedback loop, a phase of the feedback signal is controlled and a value other than 0 is inputted to the TDC even when the ADPLL is locked.

17 Claims, 33 Drawing Sheets

SECOND CLOCK OF $V_{PRE}$ IS NOT RECOGNIZED AND PLL IS LOCKED

EACH $E_{TDC}$ CANCELS EACH OTHER TO BE 0
IN 1 CYCLE OF $V_{REF}$ AND PLL IS LOCKED

PLL CIRCUIT WITH IMPROVED PHASE DIFFERENCE DETECTION

TECHNICAL FIELD OF THE INVENTION

The present invention relates to a PLL circuit, particularly, to an ADPLL (All Digital Phase-Locked Loop) in which an analog circuit is replaced with a digital circuit.

BACKGROUND OF THE INVENTION

RF-ICs used in mobile telephones and wireless LANs are still expected to grow at a high rate. At present, tendency of development of the RF-ICs is moving to one chip configuration with a base band IC. According to requirements by the base band IC having an increasing integration degree, development of the RF-ICs using miniaturized CMOS process is necessary. If miniaturization is advanced, elements fluctuation, increase of a consumption current of an analog circuit caused by increase of gate capacity and increase of an area become problems. As a countermeasure, there is an idea that the analog circuit is replaced with a digital circuit.

The present inventors focus on a TDC (Time to Digital Converter) converting a phase difference (time difference) into digital in a technique of an ADPLL.

Note that, as for techniques related to the ADPLL, there are techniques disclosed in U.S. Pat. No. 7,123,102 (Patent Document 1), U.S. Patent Application Publication No. 2005/0116258 (Patent Document 2), J. Lin, "A PVT tolerant 0.18 MHz to 600 MHz self-calibrated digital PLL in 90 nm CMOS process", ISSCC, February, 2004 (Non-Patent Document 1), T. Olsson, "A Digitally Controlled PLL for SoC Applications, IEEE JOURNAL OF SOLID-STATE CIRCUITS", May, 2004 (Non-Patent Document 2), T. Watanabe, "An All-Digital PLL for Frequency Multiplication by 4 to 1022 With Seven-Cycle Lock Time", IEEE JOURNAL OF SOLID-STATE CIRCUITS, February, 2003 (Non-Patent Document 3), and T. A. D. Riley, "A Simplified Continuous Phase Modulator Technique", IEEE TRANSACTIONS ON CIRCUIT AND SYSTEMS II: ANALOG AND DIGITAL SIGNAL PROCESSING, Vol. 41, No. 5, May, 1994 (Non-Patent Document 4). Patent Document 1 relates to automatic band selection of a VCO having a plurality of oscillation bands. Patent Document 2 relates to a dual modulus prescaler. Non-Patent Documents 1 to 3 relate to conventional arts of the TDC. Non-Patent Document 4 relates to a technique superimposing phase modulation on a fractional PLL.

SUMMARY OF THE INVENTION

Incidentally, with regard to the techniques of the ADPLL as mentioned above, as results of examinations by the present inventors, following things are found.

For example, challenges in the TDC converting a pulse having a width proportional to a phase difference into a digital value are resolution, a detection range, linearity, an occupation area and detection of the phase difference at a vicinity of 0 (Zero degrees phase difference between the two signals.). The resolution, the detection range, the linearity and the occupation area are in a relation of tradeoff, and it is necessary to select the most suitable TDC according to an application. In particular, in a transmission system in which phase modulation (GMSK) is superimposed on the fractional PLL (for example, Non-Patent Document 4), there are high requirements in all matters.

A configuration example of the PLL examined as a premise of the present invention is shown in FIG. 33. The PLL in FIG. 33 comprises a phase frequency detector (PFD), a charge pump CP, an analog loop filter ALF, a voltage controlled oscillator VCO and a divider DIV. The DIV frequency-divides an output of the VCO. The PFD outputs UP/DOWN signals according to a phase difference of an inputted reference signal ($V_{REF}$)/a feedback signal ($V_{DIV}$). The CP outputs an current of a value corresponding to the UP/DOWN signals. The ALF removes a high frequency noise component from the current, converts the same into a voltage, and thereby controls the VCO.

A configuration example of the ADPLL examined as a premise of the present invention is shown in FIG. 34. The ADPLL in FIG. 34 comprises a phase frequency comparator PFD, a time to digital converter TDC, a digital loop filter DLF, a digitally controlled oscillator DCO and a divider DIV. The DIV frequency-divides an output of the DCO. The PFD outputs a pulse PE having a width corresponding to a phase difference of an inputted reference signal ($V_{REF}$)/a feedback signal ($V_{DIV}$) and a polarity judgment signal POL. The TDC outputs a digital value corresponding to the PE/POL. The DLF removes a high frequency noise component from the signal and controls the DCO.

A configuration example of the PFD used in the ADPLL of FIG. 34 is shown in FIG. 35. In the PFD in FIG. 35, an exclusive OR (XOR) for phase difference detection and a D-type flip-flop (DFF) for polarity judgment are added to a widely used DFF-type PFD.

A configuration example of the TDC using a delay-line is shown in FIG. 36A. The TDC in FIG. 36A comprises N pieces of delay devices, N pieces of D-type flip-flops (DFFs) and an inverter (N: a natural number). A delay device of a small delay amount is composed of, for example, inverters of two stages.

An operation example of the TDC in FIG. 36A is shown in FIG. 36B. When the PE having a length of $T_{PE}$ [sec] is inputted, a signal is transmitted to a D1, a D2, . . . with a delay amount of d [sec], respectively. At a falling of the PE, the DFF is sampled, and outputs Q1, Q2, . . . are decided. In a case described here, a Q1 to a Q4 become 1 (one). To what number of the Qs becomes 1 depends on the $T_{PE}$ [sec]. That is, a pulse width is converted into digital. In this configuration, since decision is made by a delay amount of one delay device, phase difference detection precision (resolution) for the PE having a certain width is favorable. And, since sizes of all delay devices are equal, linearity is favorable. Note that, when the detection range is to be made wide, many delay devices and DFFs are necessary, as a result, there is a problem that the occupation area becomes large. And, if a through rate of a circuit (XOR in FIG. 35) in a former stage generating a phase difference pulse is small, a thin pulse PE corresponding to a slight phase difference at a vicinity of 0 is not inputted. Therefore, the phase difference at the vicinity of 0 cannot be detected. In other words, noise of an output of the PLL locked by the phase difference of 0 becomes worse.

A configuration example of the TDC examined as a premise of the present invention is shown in FIG. 37 (Non-Patent Document 1). In the TDC of FIG. 37, among the delay devices configuring the delay-line, a delay amount of a delay device at a former stage side is made small, and, delay amounts of the delay devices at latter stages are made larger gradually. A phase difference pulse width is measured by a delay element weighted by a LOG scale at an input side. Since the decision is made by the delay amount of the smallest delay device, the resolution is favorable. And, the detection range is wide and the occupation area is small. Note that, since sizes of the delay elements are not the same, there is a problem in the linearity.

Configuration examples of the PFD and the TDC examined as premises of the present invention are shown in FIGS. 38A and 38B (Non-Patent Document 2). FIG. 38A shows the PFD and FIG. 38B shows the TDC. In the TDC in FIG. 38B, measurement is performed using a high speed clock. A counter is operated at a rising and a falling of the high speed clock and the phase difference pulse width is measured. In this circuit, the detection range is wide, the occupation area is small and the linearity is favorable. Note that, in order to obtain the resolution necessary as the ADPLL of the RF-IC (10 to 20 psec), a clock of an extremely high frequency (50 to 100 GHz) is required, and accordingly, there is a problem in realization thereof.

A configuration example of the TDC examined as a premise of the present invention is shown in FIG. 39 (Non-Patent Document 3). This TDC implementation in FIG. 39 uses a ring oscillator oscillating only when the phase difference pulse is HIGH and a counter in combination and measures the pulse width. The phase difference in a wide range is roughly measured by the counter, and a slight phase difference between them is measured with high precision at the delay-line of the ring oscillator. In this circuit, the resolution, the detection range and the linearity are favorable. Note that, since a spurious and a consumption current of the ring oscillator that particularly become problems in performances of the RF-IC increase, the TDC is not practical.

The TDCs in FIG. 37 to FIG. 39 require the phase difference pulse in common. If the through rate of the circuit (the XOR in FIG. 35) in the former stage generating the phase difference pulse is small, thin pulse PE corresponding to a slight phase difference at the vicinity of 0 is not inputted. Therefore, the phase difference at the vicinity of 0 cannot be detected. That is, noise of an output of the PLL locked by the phase difference of 0 becomes worse.

Therefore, one object of the present invention is to provide a technique capable of improving phase difference detection at the vicinity of the phase difference of 0 in the ADPLL composed of a digital circuit.

The above and other objects and novel characteristics of the present invention will be apparent from the description of this specification and the accompanying drawings.

(1) A PLL circuit according to a representative embodiment is an ADPLL for a frequency synthesizer in which a countermeasure is taken against a problem in phase difference detection at a vicinity of 0. An offset value is added to (subtracted from) any portion in a loop so that the PLL circuit is locked with a constant phase difference between the reference signal $V_{REF}$ and the feedback signal $V_{DIV}$.

(2) The phase difference in a wide range is roughly measured by a counter using an output of a digitally controlled oscillator or an output of a divider to which an output of the digitally controlled oscillator is used as a clock, and the slight phase difference between them is measured with high precision using a delay-line.

(3) By taking the phase difference after converting phases of the feedback signal and the reference signal into digital, a fundamental countermeasure is taken against the problems in the phase difference detection at the vicinity of 0.

The effects obtained by typical aspects of the present invention will be briefly described below.

(1) Even if a through rate of a circuit in a former stage generating a phase difference pulse is small, the phase difference pulse becomes HIGH certainly, and change thereof can be transmitted.

(2) The phase difference detection when the PLL circuit is locked can be carried out precisely.

BRIEF DESCRIPTIONS OF THE DRAWINGS

DESCRIPTIONS OF THE PREFERRED EMBODIMENTS

Hereinafter, embodiments of the present invention will be described in detail with reference to the accompanying drawings. Note that the same components are denoted by the same reference symbols throughout the drawings for describing the embodiment, and the repetitive description thereof will be omitted.

First Embodiment

Figure 1:
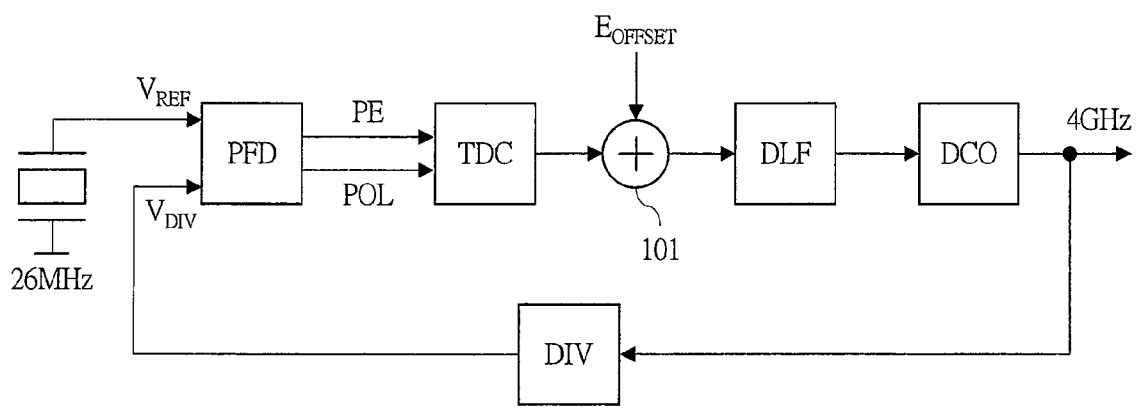
FIG. 1 is a block diagram showing a configuration example of an ADPLL (all digital phase-locked loop) according to a first embodiment of the present invention.

FIG. 1 is a block diagram showing a configuration example of an ADPLL (all digital phase-locked loop) according to a first embodiment of the present invention.

First, with reference to FIG. 1, an example of a configuration of the ADPLL according to the first embodiment is explained. The ADPLL according to the first embodiment is, for example, a semiconductor integrated circuit, and is formed over one semiconductor chip by a well-known semiconductor production technique. The ADPLL in FIG. 1 comprises, for example, a phase frequency detector PFD, a time to digital converter TDC, a digital loop filter DLF, a digitally controlled oscillator DCO, a divider DIV and the like.

The phase frequency detector PFD compares phases and frequencies of a reference signal $V_{REF}$ and a feedback signal $V_{DIV}$. The time to digital converter TDC converts an output of the phase frequency detector PFD into a digital value. The digital loop filter DLF removes a high frequency noise component from an output of the time to digital converter TDC. The digitally controlled oscillator DCO controls a frequency based on an output of the digital loop filter DLF. The divider DIV frequency-divides a frequency of an output signal of the digitally controlled oscillator DCO and outputs the feedback signal $V_{DIV}$. And, a feedback loop is composed of these circuits.

Note that, as an example, a frequency of the reference signal $V_{REF}$ is 26 MHz, a frequency of the output signal of the DCO when the ADPLL is locked is 4 GHz and a frequency of the feedback signal $V_{DIV}$ when the ADPLL is locked is 26 MHz.

In the ADPLL according to the first embodiment, an adder 101 is inserted into the output of the TDC and an offset $E_{OFFSET}$ is added. When the ADPLL is locked, the ADPLL operates so that an input of the DLF becomes 0. That is, the ADPLL controls the phase of the feedback signal $V_{DIV}$ so that the output of the TDC becomes $-E_{OFFSET}$ when the ADPLL is locked. Since a phase difference pulse of the PFD can be expanded by the offset $E_{OFFSET}$ even when the ADPLL is locked, the TDC can convert slight change of a phase difference into digital (numerical representation) precisely.

In a conventional PLL, if the PLL is locked to have the phase difference, a large CP current is carried and a spurious and noise are generated. In the ADPLL, since all signals are digital, such a problem does not occur.

Note that, the adder 101 may be a subtracter, and a value of the offset may be either positive or negative. In addition, a position to insert the adder 101 may be other points in the loop.

Figure 2:
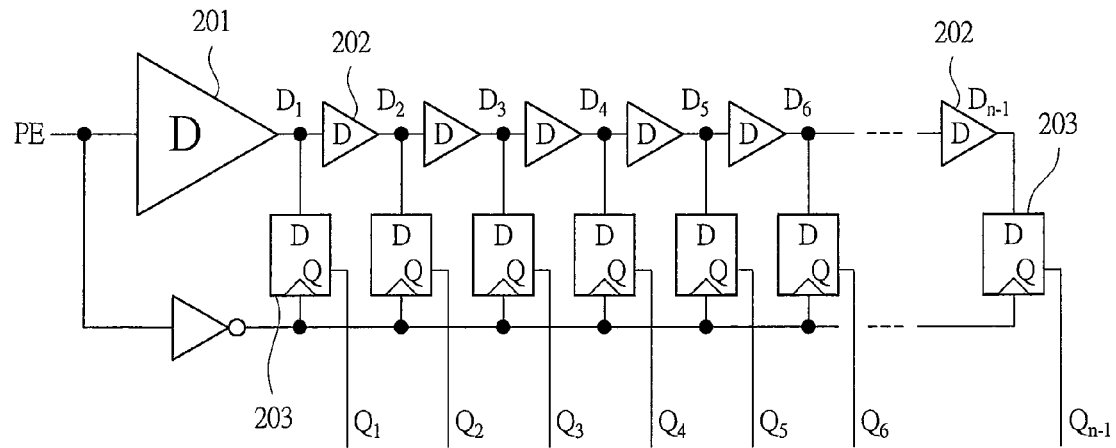
FIG. 2 is a circuit diagram showing a configuration example of a time to digital converter in FIG. 1.

Next, a configuration of the TDC suitable for this method is explained. FIG. 2 is a circuit diagram showing a configuration example of the time to digital converter TDC in FIG. 1.

The TDC in FIG. 2 comprises a delay device 201 having a large delay amount, a plurality of delay devices 202 having delay amounts smaller than that of the delay device 201, a plurality of D-type flip-flops DFFs 203 and the like. By the delay device 201 at a first stage and the plurality of delay devices 202 at latter stages, a delay line is configured. Each of the delay devices is composed of, for example, inverters of two stages. Outputs $D_1$ to $D_{n-1}$ of respective delay devices are inputted to data inputs Ds of respective DFFs. Each of DFFs has an input of an inversion signal of a PE as a clock input and outputs data outputs Q1 to Qn−1.

Figure 36A:
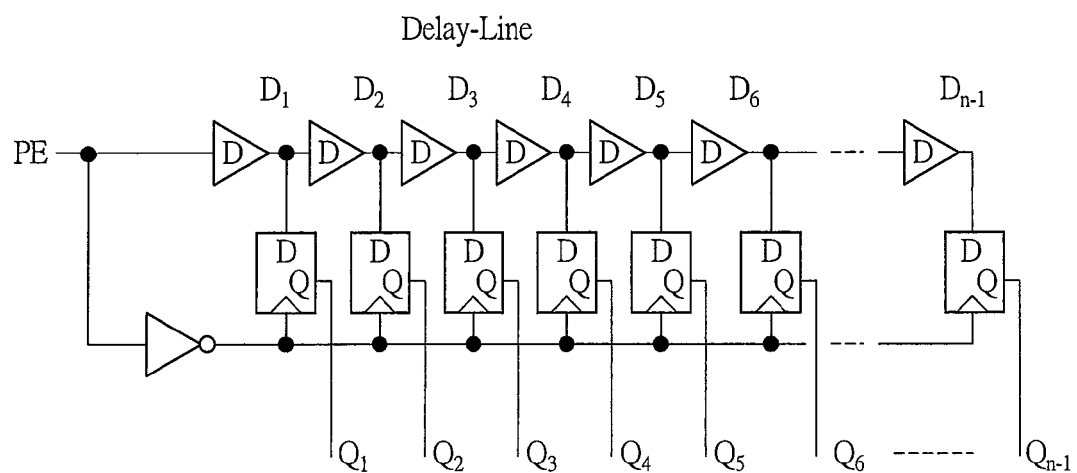
FIG. 36A is a diagram showing a configuration example of the TDC using a delay-line.
Figure 36B:
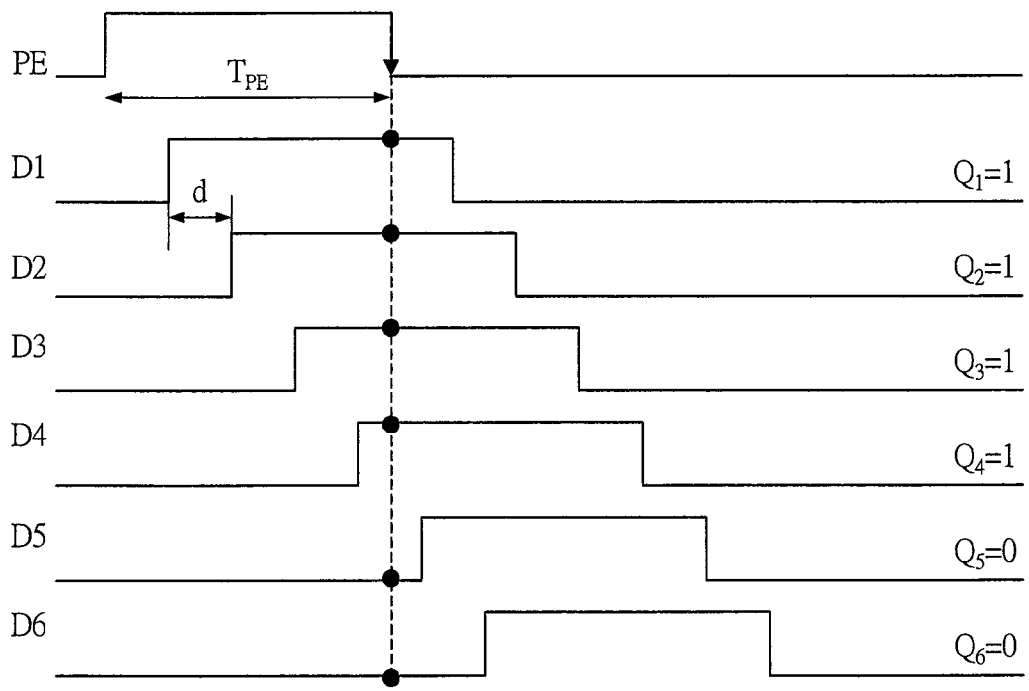
FIG. 36B is a diagram showing an operation example of the TDC in FIG. 36A.
Figure 37:
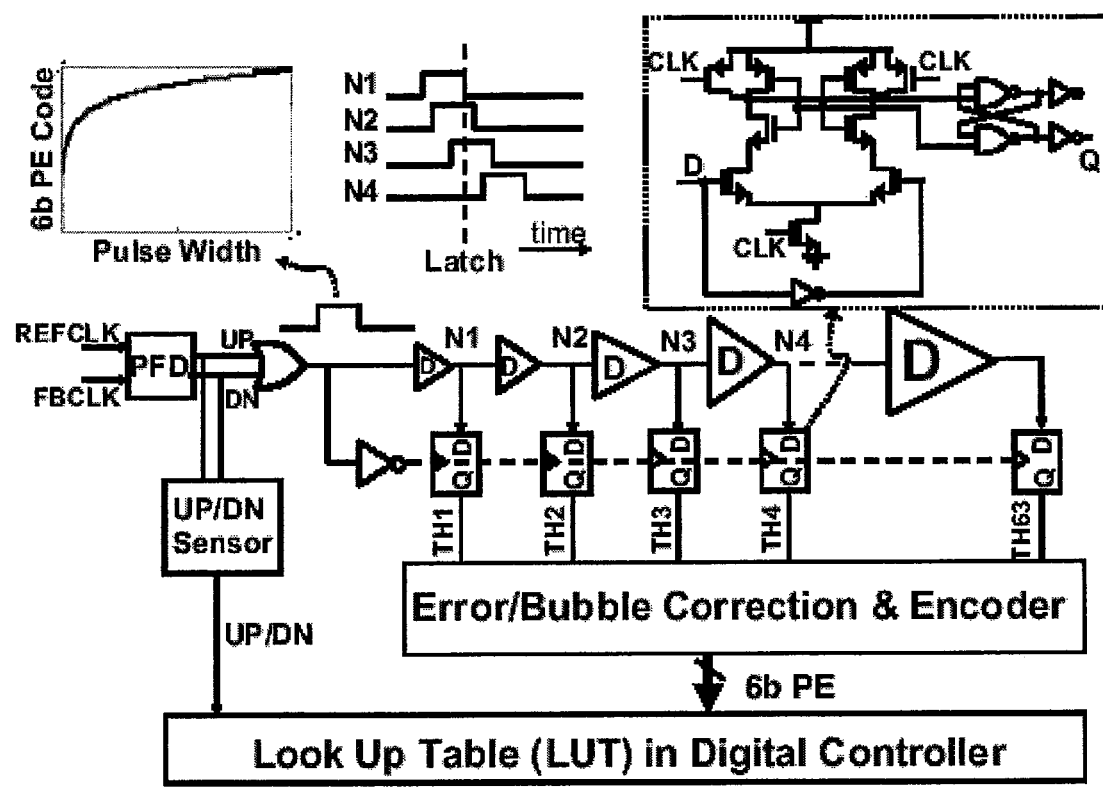
FIG. 37 is a block diagram showing a configuration example of a TDC examined as a premise of the present invention.
Figure 38A:
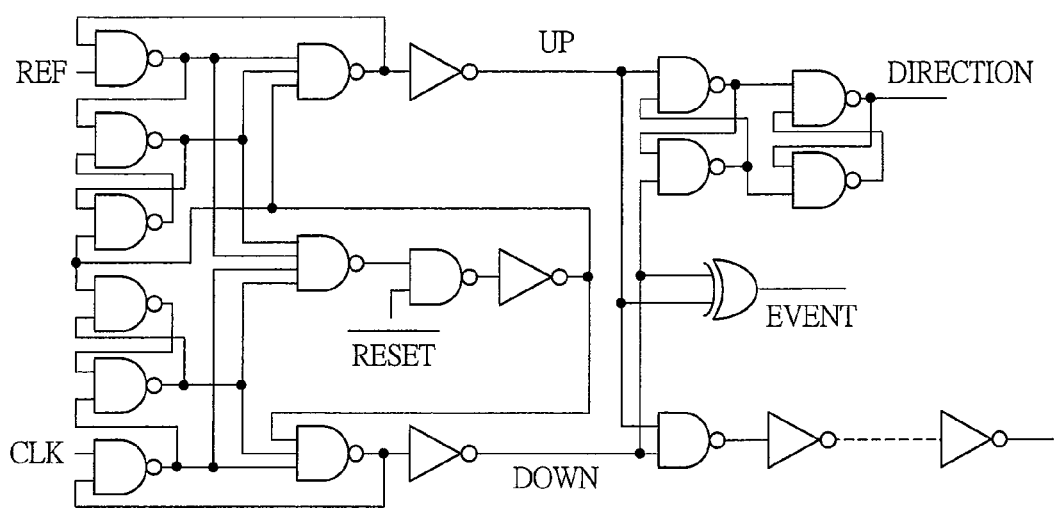
FIG. 38A is a block diagram showing a configuration example of a PFD examined as a premise of the present invention.
Figure 38B:
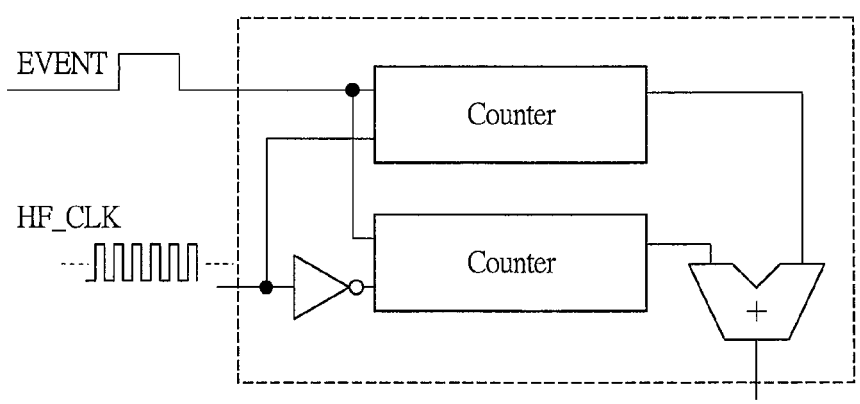
FIG. 38B is a block diagram showing a configuration example of the TDC.
Figure 39:
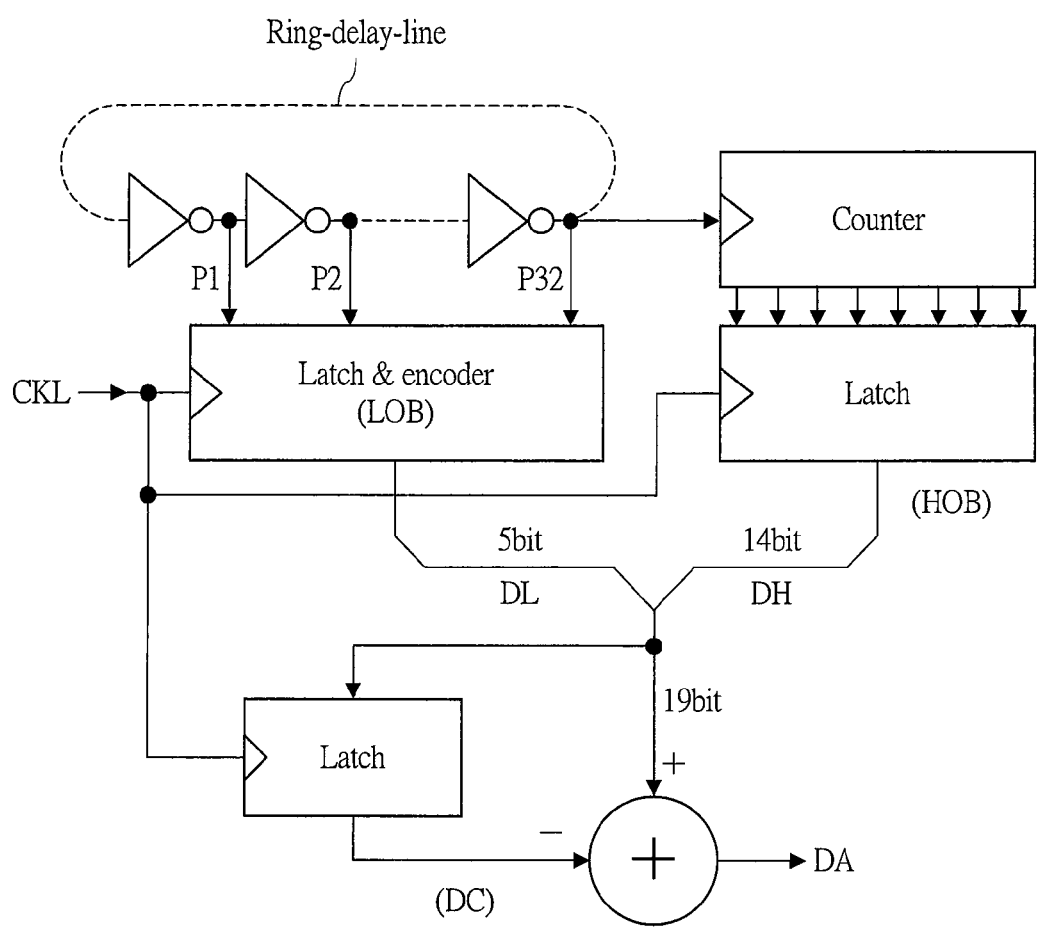
FIG. 39 is a block diagram showing a configuration example of the TDC examined as a premise of the present invention.

For example, a timing chart in FIG. 36B is examined. In the ADPLL of the first embodiment, since the offset is added, a $T_{PE}$ [sec] does not become 0 [sec] but becomes a long pulse even when the ADPLL is locked. Therefore, most of the Qs at former stages become 1 and many delay devices and DFFs are required. An important thing is change from a phase when the ADPLL is locked, and outputs of the delay devices in which 1 continues at the former stages are not so important.

Therefore, in the same way as the TDC in FIG. 2, the delay device 201 having large delay is inserted into the first stage and large delay is generated beforehand, and thereby the number of the delay devices and the DFFs are reduced.

Figure 3:
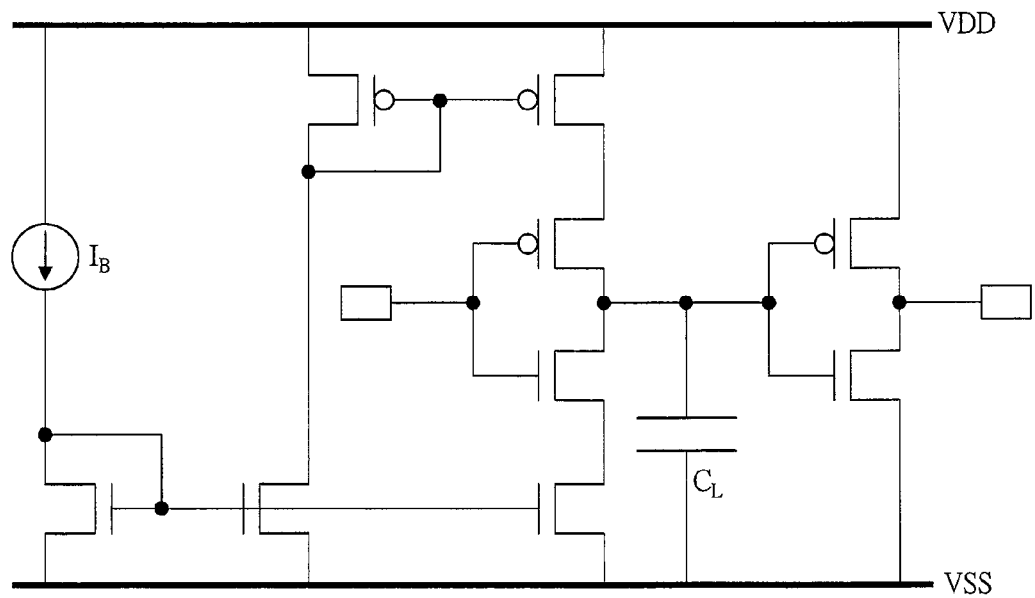
FIG. 3 is a circuit diagram showing a configuration example of a delay device at a first stage in FIG. 2.

FIG. 3 is a circuit diagram showing a configuration example of the delay device 201 at the first stage in FIG. 2.

In the delay device in FIG. 3, a current $I_B$ and capacitance $C_L$ are set so that the delay amount is in proportion to the offset inputted. In assumption that the offset is changed, the $I_B$ and $C_L$ are made changeable by programming.

In general, if the large delay is inserted into the first stage, the phase difference at the vicinity of 0 cannot be detected. Therefore, it becomes a problem when the phase difference changes from plus to minus by passing 0 at frequency switching. Note that, the VCO built inside the RF-IC usually has a plurality of oscillation bands and automatically selects one of them before transiting to a phase lock processing. Therefore, it is possible to perform control so that the phase change is carried out without passing 0 (see Patent Document 1). Therefore, there is no problem in a detection range of the phase.

Figure 35:
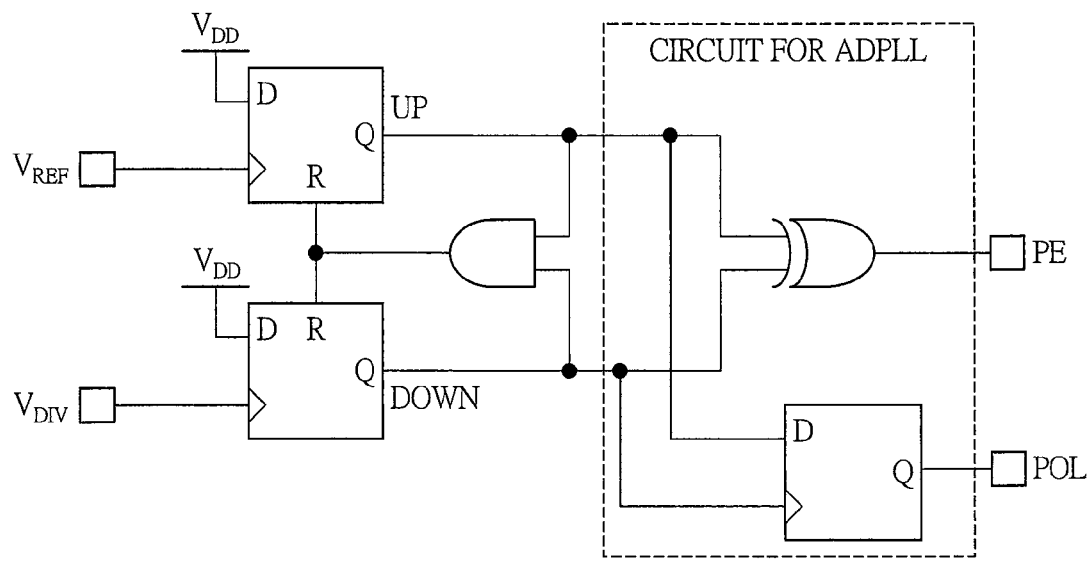
FIG. 35 is a diagram showing a configuration example of a PFD used in the ADPLL in FIG. 34.

Therefore, in the ADPLL according to the first embodiment, the offset value is added (subtracted) at any point in the loop, and the ADPLL is made to be locked with the constant phase difference between the reference signal $V_{REF}$ and the feedback signal $V_{DIV}$. Thereby, even if a through rate of a circuit in the former stage generating the phase difference pulse (for example, the XOR in FIG. 35) is small, the phase difference pulse becomes HIGH certainly, and change thereof can be transmitted. Further, by inserting the delay device having the large delay into the first stage of the TDC and generating the large delay beforehand, numbers of the delay devices and the DFFs are reduced. Consequently, the ADPLL for a frequency synthesizer having sufficient resolution, linearity and occupation area can be provided.

Second Embodiment

Figure 4:
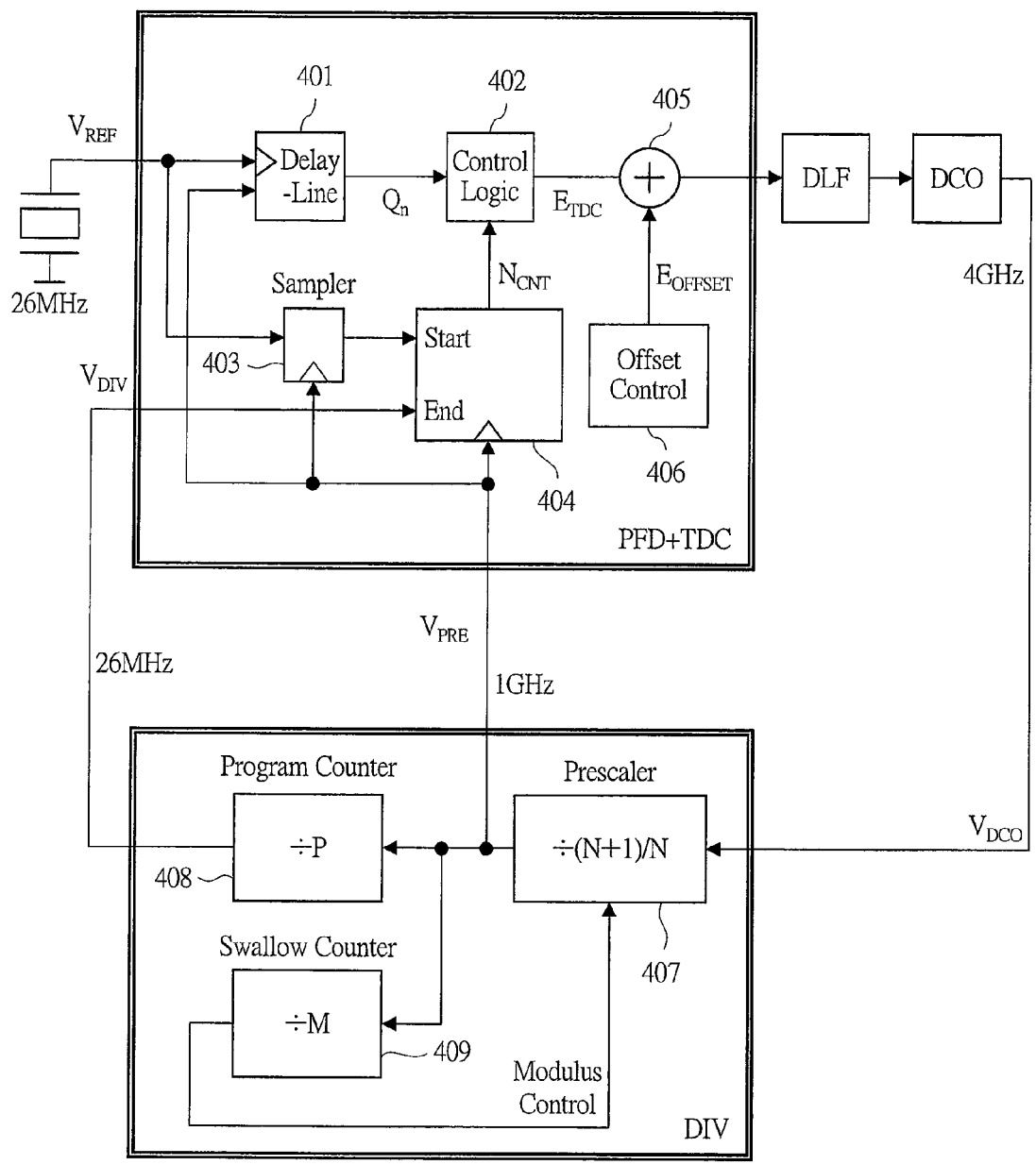
FIG. 4 is a block diagram showing a configuration example of an ADPLL according to a second embodiment of the present invention.

FIG. 4 is a block diagram showing a configuration example of an ADPLL according to a second embodiment of the present invention.

First, with reference to FIG. 4, an example of the configuration of the ADPLL according to the second embodiment is explained. The ADPLL according to the second embodiment is, for example, a semiconductor integrated circuit, and is formed over one semiconductor chip by the well-known semiconductor production technique. The ADPLL in FIG. 4 comprises, for example, a phase frequency detector PFD and a time to digital converter TDC (a piece of phase detecting or frequency detecting and time-to-digital converting equipment, hereinafter, referred to as (PFD+TDC)), a digital loop filter DLF, a digitally controlled oscillator DCO, a divider DIV and the like.

The phase frequency detector PFD compares phases and frequencies of a reference signal $V_{REF}$ and a feedback signal $V_{DIV}$. The time to digital converter TDC converts an output of the phase frequency detector PFD into a digital value (discrete numeric value). The digital loop filter DLF removes a high frequency noise component from an output of the time to digital converter TDC. The digitally controlled oscillator DCO controls a frequency based on an output of the digital loop filter DLF. The divider DIV frequency-divides a frequency of an output signal of the digitally controlled oscillator DCO and outputs the feedback signal $V_{DIV}$. And, a feedback loop is composed of these circuits.

And, the (PFD+TDC) comprises a delay-line 401, control logic 402, a sampler 403, a counter 404, an adder 405, an offset control 406 and the like. The DIV comprises a prescaler 407, a program counter 408, a swallow counter 409 and the like.

Note that, as an example, the frequency of the reference signal $V_{REF}$ is 26 MHz, a frequency of the output signal of the DCO when the ADPLL is locked is 4 GHz, the frequency of the feedback signal $V_{DIV}$ when the ADPLL is locked is 26 MHz and a frequency of an output $V_{PRE}$ of the prescaler 407 when the ADPLL is locked is 1 GHz.

In the ADPLL according to the second embodiment, the (PFD+TDC) in which the phase difference is measured in a following method is adopted. That is, the phase difference in a wide range between the $V_{REF}$ and the $V_{DIV}$ is roughly measured by the counter 404 using an output $V_{DCO}$ of the DCO or an output ($V_{PRE}$ in FIG. 4) of the divider DIV having an input of the $V_{DCO}$ as a clock, and a slight phase difference between them (that is, between the $V_{REF}$ and the $V_{PRE}$) is measured with high precision at the delay-line 401.

Herein, as the clock of the counter 404, the output $V_{PRE}$ of the prescaler 407 of the DIV is used. As the prescaler 407, for example, a dual modulus prescaler in Patent Document 2 is used.

When the ADPLL is locked, an output of the $V_{PRE}$ is also locked. Therefore, a relation between the phase difference counted using this as the clock and a time is uniquely determined. And, by using a signal existing originally as the clock, increase of a spurious and a consumption current can be prevented. By the sampler 403, the $V_{REF}$ is sampled by the $V_{PRE}$ once and synchronized to be a start signal of the counter 404, and the $V_{DIV}$ is made an end signal of the counter 404. Thereby, the phase difference between the $V_{REF}$ and the $V_{DIV}$ is measured with precision of the $V_{PRE}$.

And, the phase difference of the $V_{REF}$ and the $V_{PRE}$ is measured at the delay-line 401. The control logic 402 synthesizes phase differences measured by the counter 404 and the delay-line 401. Note that, if there is a difference in routes of input signals or there is a difference in sensitivities to the input signals, an error occurs at synthesis. For example, a case in which the phase difference increase by 0.02 from 2.98 to 3.00 as shown in a following expression is considered. Note that, a calculation expression for explanation is used in this example.

(counter=2, delay-line=0.98)=2.98→(counter=3, delay-line=0)=3.00.

If the delay-line 401 cannot follow change of the counter 404, (counter=2, delay-line=0.98)=2.98→(counter=3, delay-line=0.99)=3.99≠3.00.

As a result, an error of approximately 1 occurs. And, as described above, in a vicinity of a position in which the delay-line 401 outputs 0, an accurate phase error cannot be calculated by the through rate of the circuit at the former stage. That is, in a case where an output of the delay-line is a value near 1 or 0, the accurate phase error cannot be calculated. As a countermeasure against this, the phase difference is measured in two or more systems in which the phase differences that cannot be detected precisely are mutually different, and they are appropriately switched to be used.

An offset circuit (the adder 405, the offset control 406) in a latter stage of the control logic 402 adjusts the phase relation between the $V_{REF}$ and the $V_{DIV}$ when the ADPLL is locked. Thereby, timing design becomes easy. Details thereof are explained hereinafter.

Figure 5:
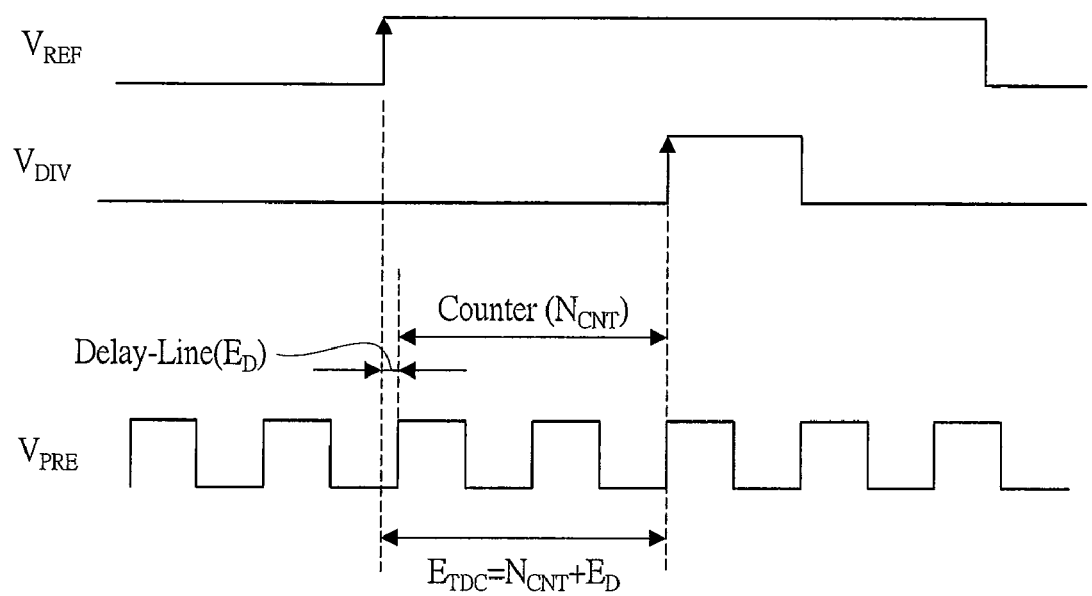
FIG. 5 is a diagram showing a timing chart of phase difference detection according to the second embodiment of the present invention.

A timing chart of phase difference detection is shown in FIG. 5. The (PFD+TDC) converts the phase difference (time difference) between rising edges of the $V_{REF}$ and the $V_{DIV}$ into a digital code. The $V_{DIV}$ synchronizes with the $V_{REF}$. The phase difference obtained by measuring a period from a rising of the $V_{REF}$ to a rising of the $V_{DIV}$ by the counter 404 using the clock $V_{PRE}$ is defined as $N_{CNT}$. On the other hand, the slight phase difference that cannot be measured by the counter 404 is measured at the delay-line 401. Therefore, in the delay-line 401, only one cycle of the output $V_{PRE}$ of the prescaler 407 is measured. If weight of one clock of the counter 404 is defined as 1, a measurement result ED of the delay-line 401 becomes less than 1. In this case, the phase difference $E_{TDC}$ between the $V_{REF}$ and the $V_{DIV}$ becomes $N_{CNT}+E_D$.

Figure 6A:
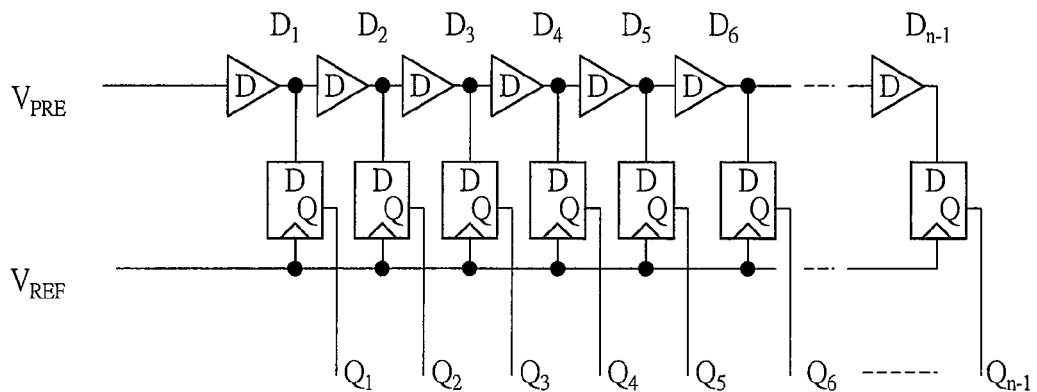
FIG. 6A is a diagram showing a configuration example of a delay-line according to the second embodiment of the present invention.
Figure 6B:
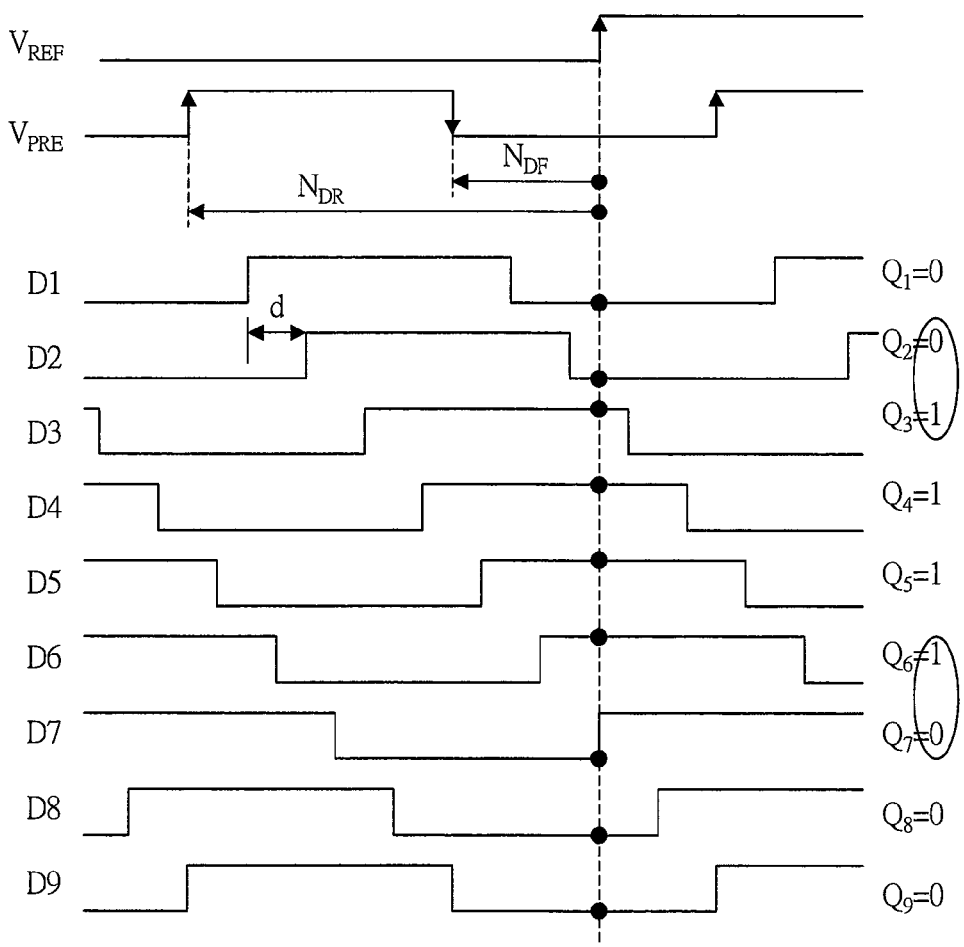
FIG. 6B is a diagram showing a timing chart of the delay-line in FIG. 6A.

A configuration example of the delay-line 401 is shown in FIG. 6A. And, a timing chart thereof is shown in FIG. 6B.

The rising edge and the falling edge of the $V_{PRE}$ just before the $V_{REF}$ are measured. Although basic operation is the same as that in FIGS. 36A and 36B, in order to detect edges, decoding is carried out while paying attention to 1→0, or 0→1 of an output Qn (n=1, 2, 3, ...). A value at which the Qn becomes 1→0 first in an increasing order is defined as $N_{DR}$, and a value at which the Qn becomes 0→1 is defined as $N_{DF}$. If a value obtained by measuring one cycle of the $V_{PRE}$ by the delay-line 401 is defined as $N_{DPRE}$, a rising phase difference $E_{DR}$ and a falling phase difference $E_{DF}$ are obtained by following expressions.

$$E_{DR}=N_{DR}/N_{DPRE} \quad (1)$$

$$E_{DF}=N_{DF}/N_{DPRE} \quad (2)$$

Figure 7A:
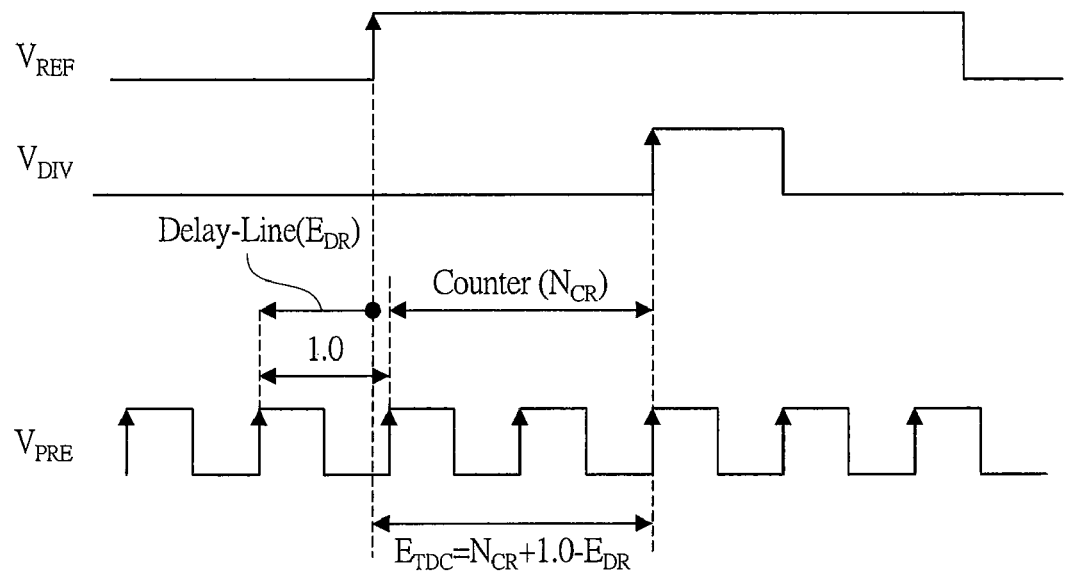
FIG. 7A is a diagram showing a timing chart when a $V_{REF}$ goes ahead of a $V_{DIV}$ and a phase difference is measured at a rising edge according to the second embodiment of the present invention.
Figure 7B:
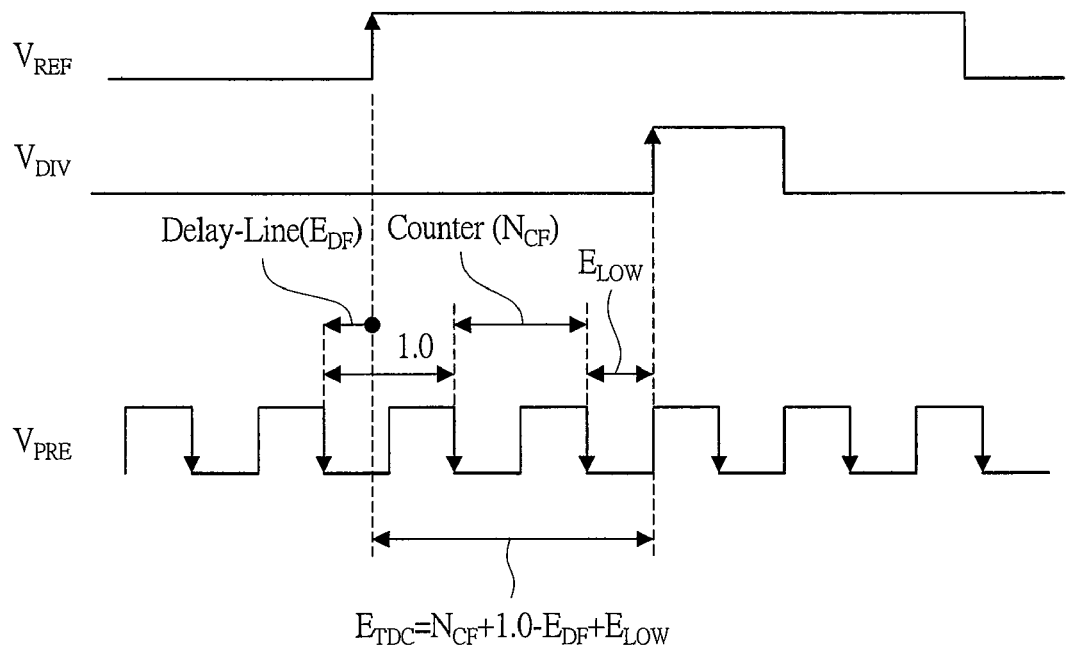
FIG. 7B is a diagram showing a timing chart when the $V_{REF}$ goes ahead of the $V_{DIV}$ and the phase difference is measured at a falling edge according to the second embodiment of the present invention.

FIGS. 7A and 7B show timing charts in a case where the $V_{REF}$ goes ahead of the $V_{DIV}$. FIG. 7A shows a case in which the phase difference is measured at the rising edge, and FIG. 7B shows a case in which the phase difference is measured at the falling edge.

As shown in FIG. 7A, the phase difference $E_{TDC}$ in the case where the phase difference is measured at the rising edge is obtained by a following expression. Herein, the phase difference obtained by measuring a period from the rising of the $V_{REF}$ to the rising of the $V_{DIV}$ by the rising edge of the clock $V_{PRE}$ is defined as $N_{CR}$.

$$E_{TDC}=N_{CR}+1.0-E_{DR} \quad (3)$$

As shown in FIG. 7B, the phase difference $E_{TDC}$ in the case where the phase difference is measured at the falling edge is obtained by a following expression. Herein, the phase difference obtained by measuring a period from the rising of the $V_{REF}$ to the rising of the $V_{DIV}$ by the falling edge of the clock $V_{PRE}$ is defined as $N_{CF}$.

$$E_{TDC}=N_{CF}+1.0-E_{DF}+E_{LOW} \quad (4)$$

Figure 8A:
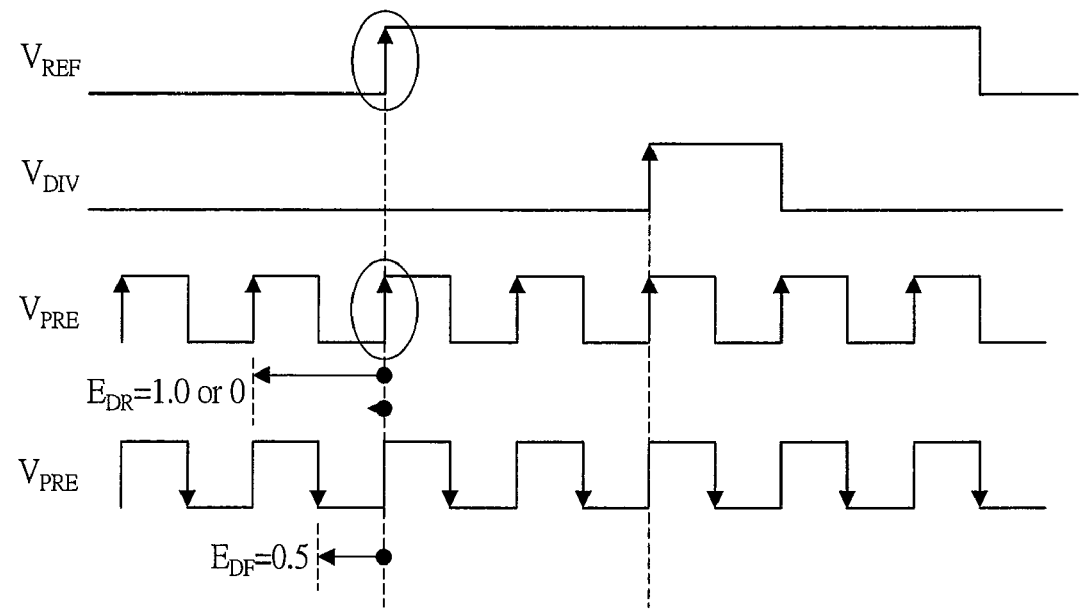
FIG. 8A is a diagram showing a timing of error occurrence in which an error occurs in measurement at the rising edge according to the second embodiment of the present invention.
Figure 8B:
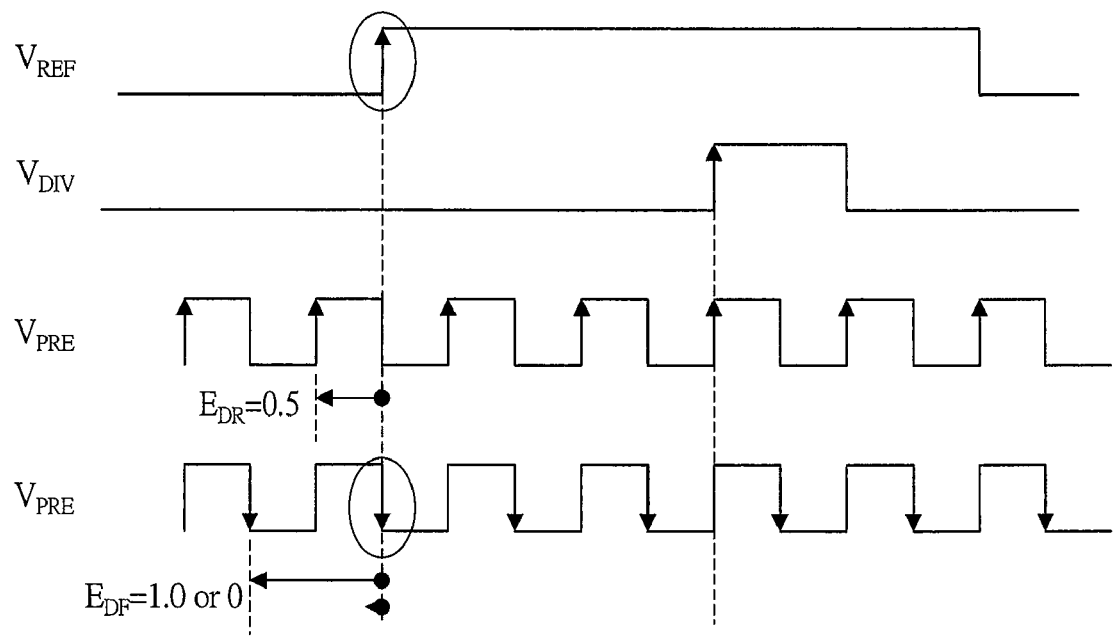
FIG. 8B is a diagram showing a timing of the error occurrence in which the error occurs in measurement at the falling edge according to the second embodiment of the present invention.

Herein, the $E_{LOW}$ is a period of LOW of the $V_{PRE}$, and if a duty ratio is 50%, it becomes 0.5. Results from the expression (3) and the expression (4) are the same. Note that, timings of error occurrence are different. The timings of error occurrence are shown in FIGS. 8A and 8B, respectively. FIG. 8A shows a case in which an error occurs in measurement at the rising edge, and FIG. 8B shows a case in which the error occurs in measurement at the falling edge.

In a timing of the error occurrence in the measurement at the rising edge, the $E_{DR}$ approaches 0 or 1 and the $E_{DF}$ approaches 0.5. On the contrary, in a timing of the error occurrence in the measurement at the falling edge, the $E_{DF}$ approaches 0 or 1 and the $E_{DR}$ approaches 0.5. Therefore, by adopting a measurement result having the output of the delay-line 401 closer to 0.5, the error can be avoided.

Figure 9:
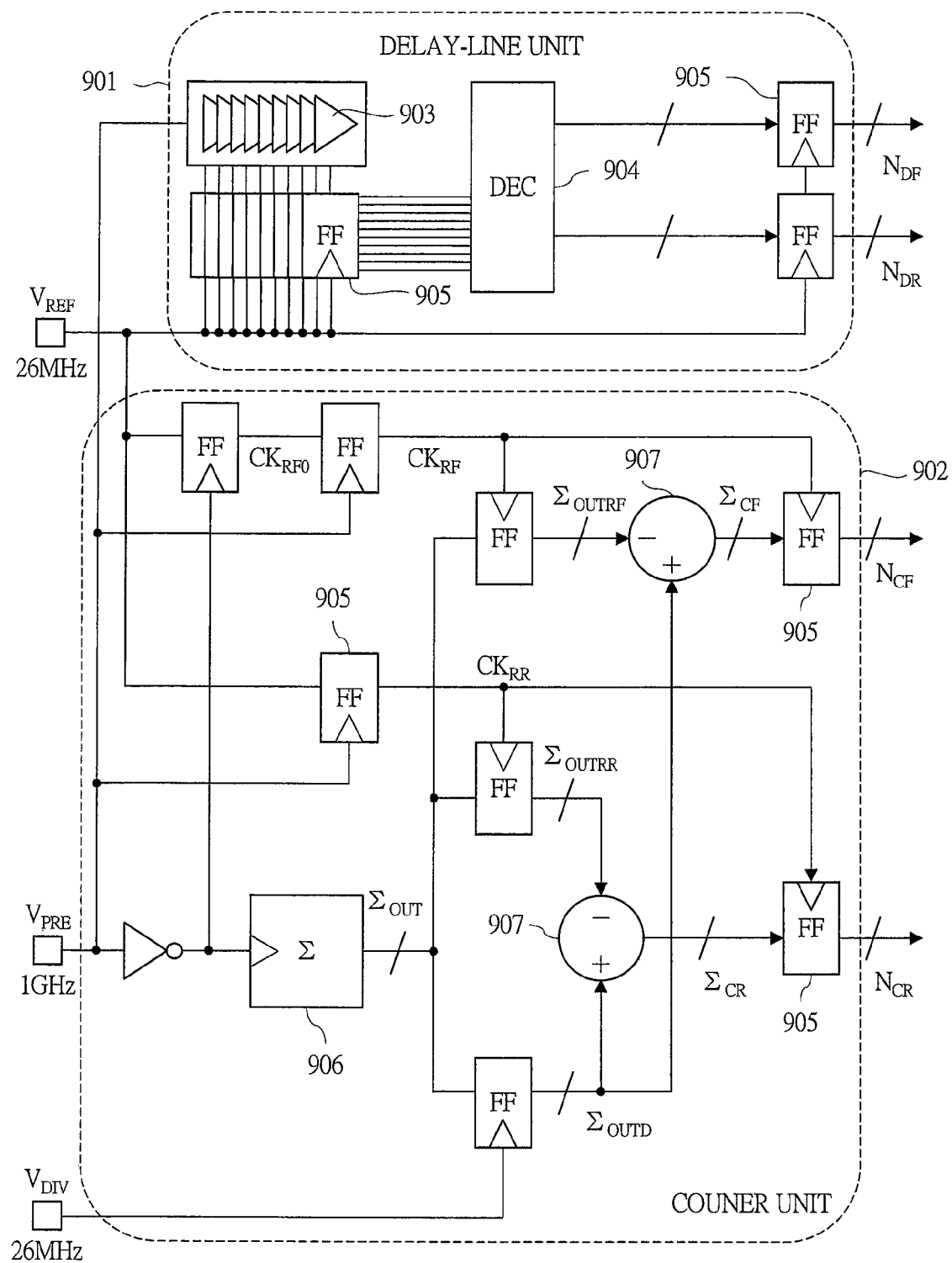
FIG. 9 is a diagram showing a configuration example of a counter of a DPFD according to the second embodiment of the present invention.

A configuration example of the counter of the DPFD is shown in FIG. 9.

As shown in FIG. 9, the DPFD comprises a delay-line unit 901 and a counter unit 902. The delay-line unit 901 comprises a plurality of delay elements 903, a decoder (DEC) 904 and a plurality of samplers (D-type flip-flops) 905. In order to reduce a circuit scale, the counter unit 902 comprises an integrator 906, two subtractors 907 and a plurality of samplers (D-type flip-flops) 905.

Figure 10:
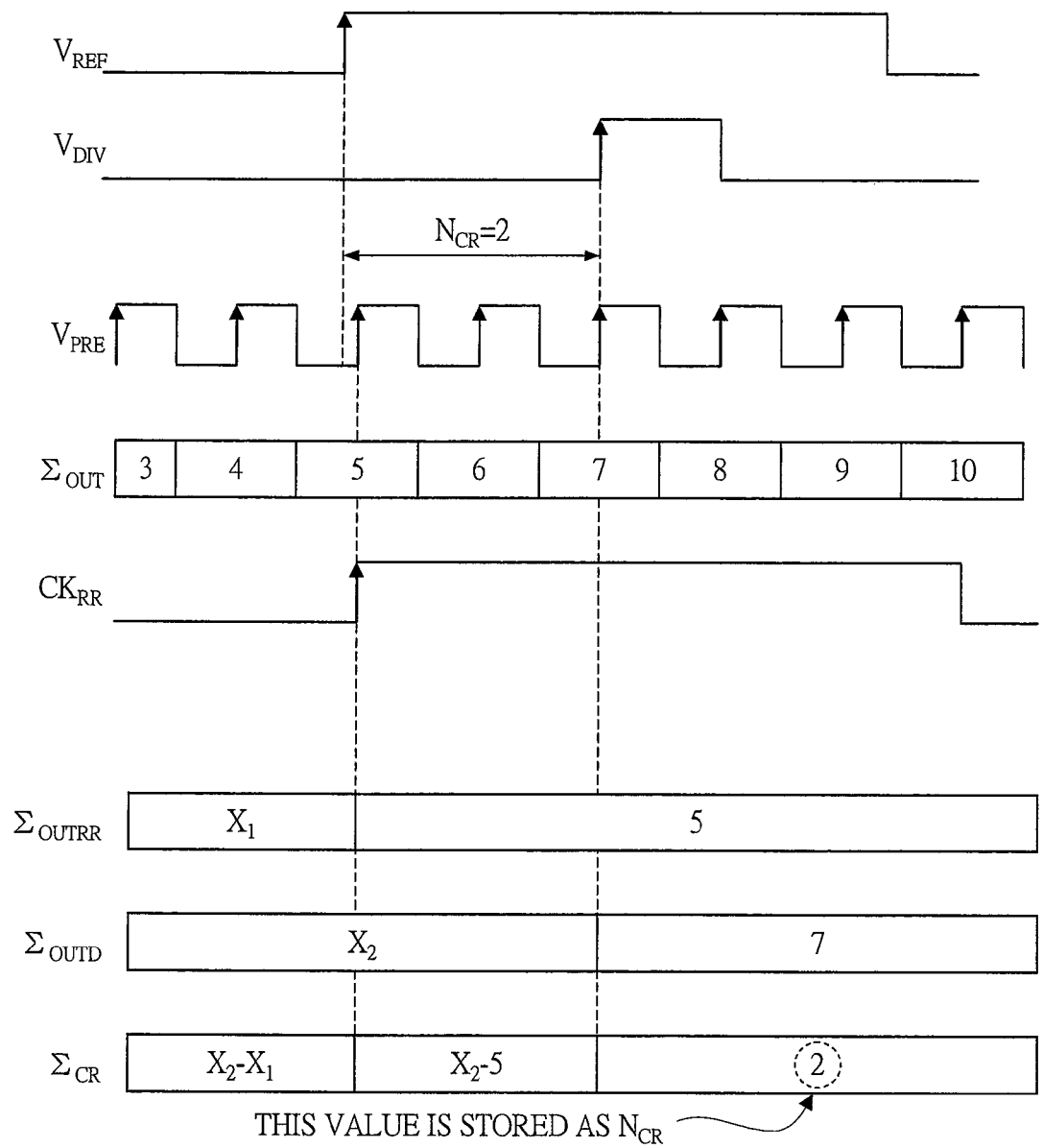
FIG. 10 is a diagram showing a timing chart of a system measuring the phase difference at a rising of the $V_{PRE}$ using an integrator according to the second embodiment of the present invention.

A timing chart of a system measuring the phase difference at the rising of the $V_{PRE}$ using the integrator 906 is shown in FIG. 10.

A value of the $N_{CR}$ to be obtained is 2. A value of an output $\Sigma_{OUT}$ of the integrator is increased by 1 by the falling of the $V_{PRE}$. A clock obtained by sampling the $V_{REF}$ by the rising of the $V_{PRE}$ is defined as $CK_{RR}$, and a value obtained by sampling $\Sigma_{OUT}$ by this clock is defined as $\Sigma_{OUTRR}$. On the other hand, a value obtained by sampling the $\Sigma_{OUT}$ by the $V_{DIV}$ is defined as $\Sigma_{OUTD}$. As a difference between the $\Sigma_{OUTD}$ and $\Sigma_{OUTRR}$, 2 is calculated, and by sampling this, $N_{CR}=2$ can be obtained.

Figure 11:
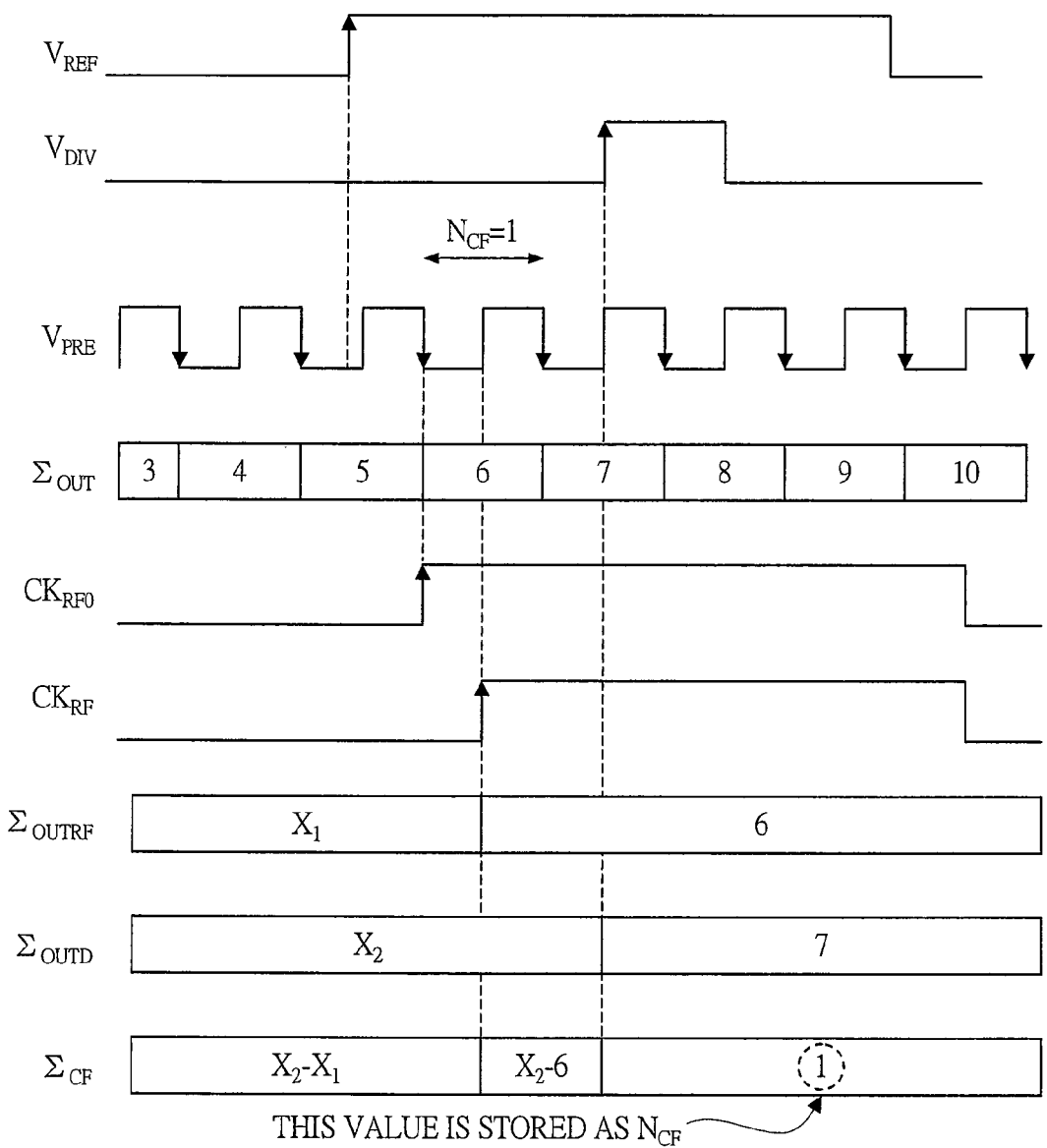
FIG. 11 is a diagram showing a timing chart of a system measuring the phase difference at a falling of the $V_{PRE}$ using the integrator according to the second embodiment of the present invention.
Figure 12:
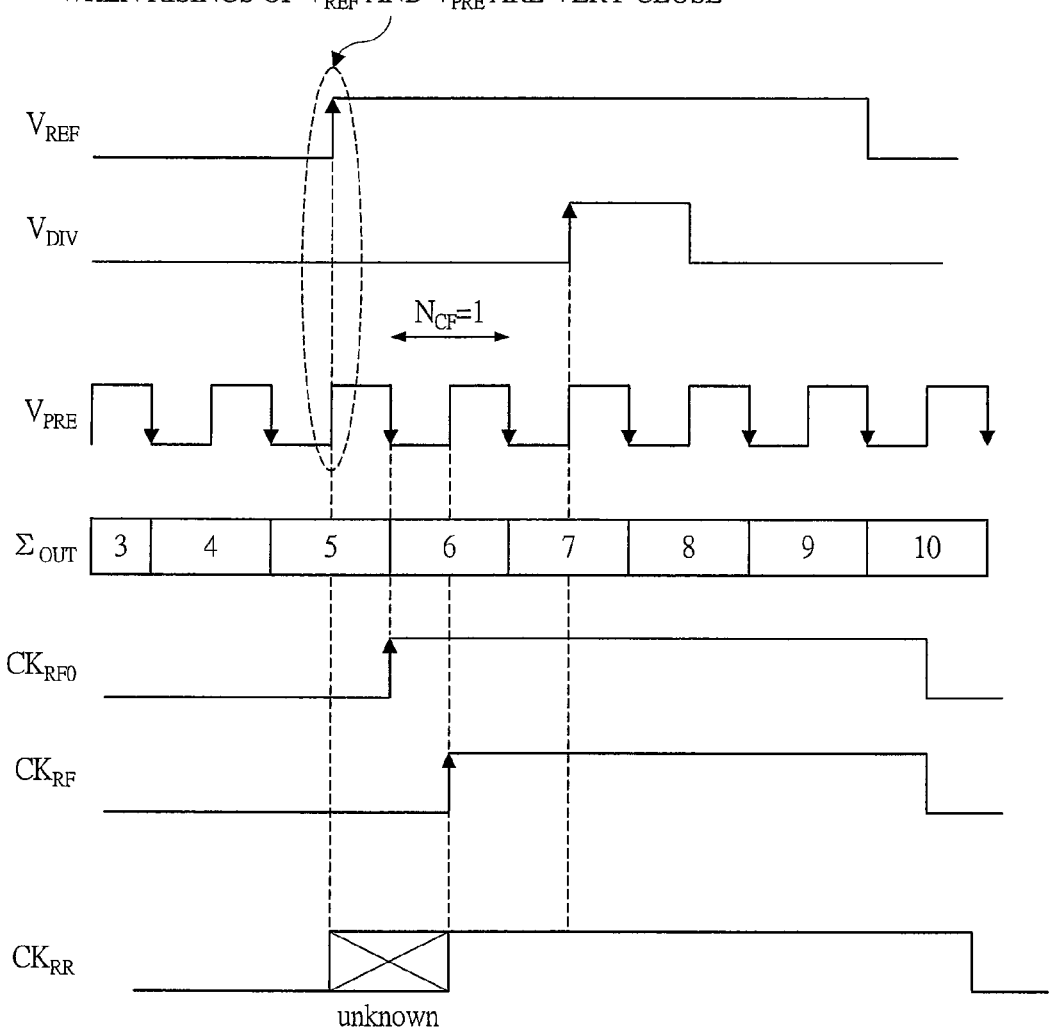
FIG. 12 is a diagram showing a timing chart when a rising of the $V_{REF}$ and the rising of $V_{PRE}$ are close according to the second embodiment of the present invention.

A timing chart of a system measuring the phase difference at the falling of the $V_{PRE}$ using the integrator is shown in FIG. 11.

A value of the $N_{CF}$ to be obtained is 1. The value of the output $\Sigma_{OUT}$ of the integrator is increased by 1 by the falling of the $V_{PRE}$. A clock obtained by sampling the $V_{REF}$ by the falling of the $V_{PRE}$ is defined as $CK_{RFO}$, and a clock obtained by further sampling the $CK_{RFO}$ by the rising of the $V_{PRE}$ is defined as $CK_{RF}$, and a value obtained by sampling the $\Sigma_{OUT}$ by this clock is defined as $\Sigma_{OUTRF}$. On the other hand, a value obtained by sampling the $\Sigma_{OUT}$ by the $V_{DIV}$ is defined as $\Sigma_{OUTD}$. As a difference between the $\Sigma_{OUTD}$ and the $\Sigma_{OUTRR}$, 1 is calculated, and by sampling this, $N_{CF}=1$ can be obtained. Seemingly, it seems that the $N_{CF}$ can be obtained simply by subtracting 1 from the $N_{CR}$.

A timing chart in a case where risings of the $V_{REF}$ and the $V_{PRE}$ are close is shown.

It can be understood that the $CK_{RF}$ can be determined by use of this technique even if it is unknown which of two risings of the $V_{RE}$ is a timing of the rising of the $CK_{RR}$. This is a reason why the $N_{CF}$ is not obtained by simply subtracting 1 from the $N_{CR}$.

Figure 13:
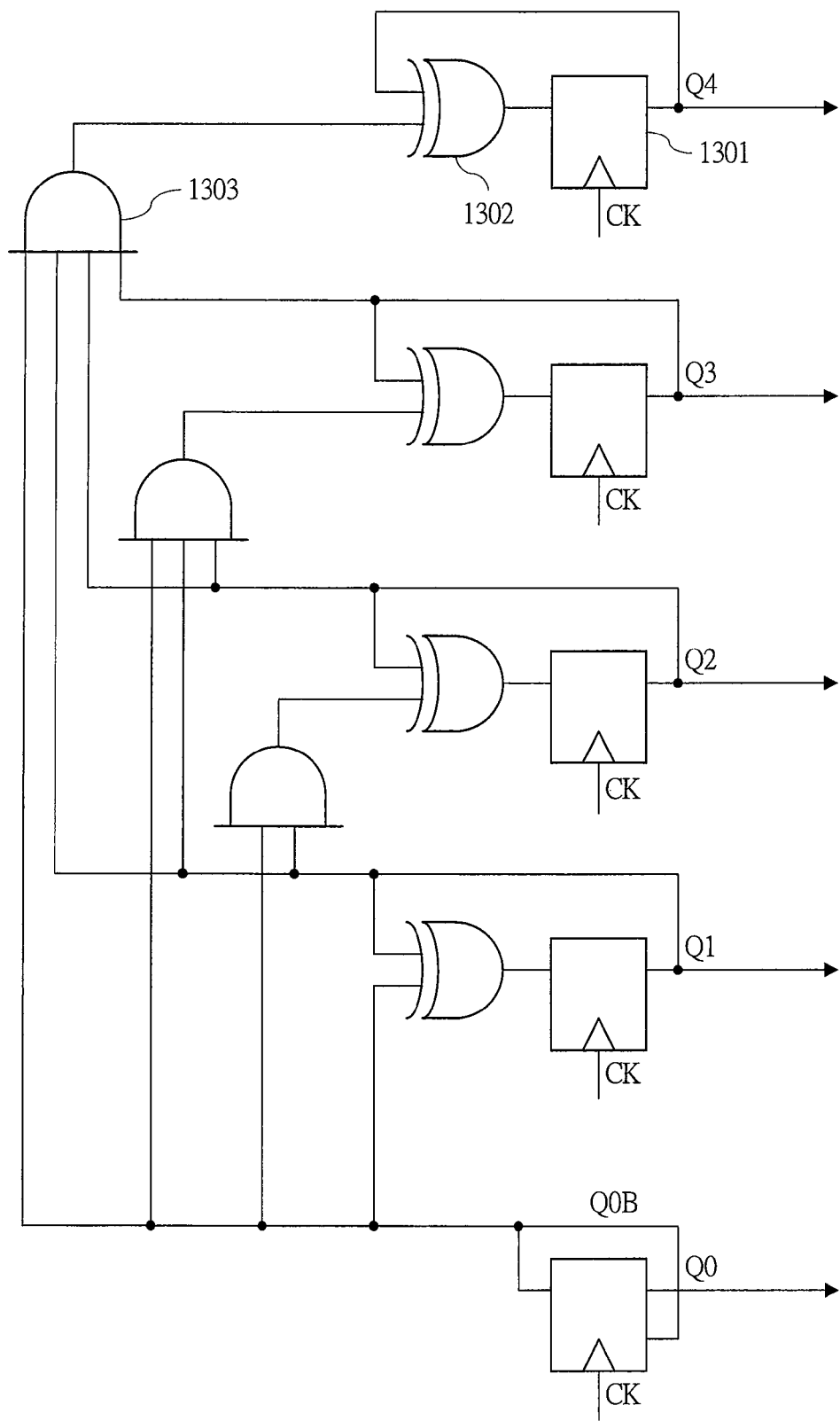
FIG. 13 is a circuit diagram showing a configuration example of the integrator of a counter unit of the DPFD according to the second embodiment of the present invention.

A configuration example of the integrator 906 is shown in FIG. 13.

The integrator 906 can be configured of a synchronous counter composed of a plurality of DFFs 1301, a plurality of XORs 1302 and a plurality of ANDs 1303. The number of bits must be at least a value of the difference or more.

Figure 14A:
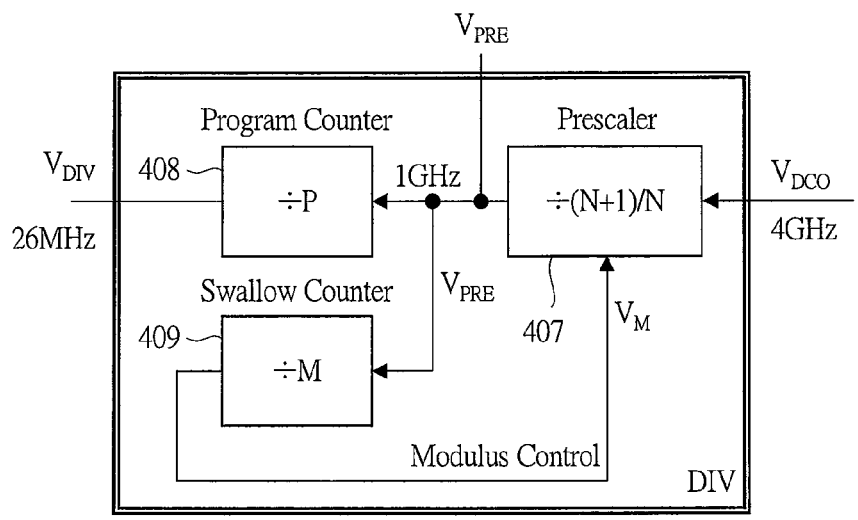
FIG. 14A is a diagram showing a configuration example of a DIV according to the second embodiment of the present invention.
Figure 14B:
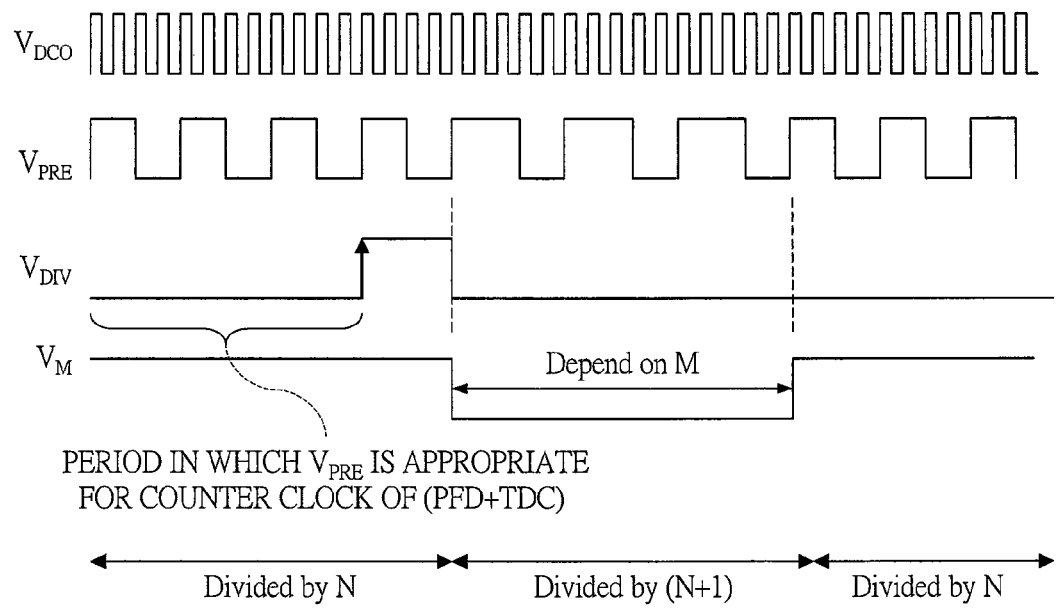
FIG. 14B is a diagram showing an example of a timing of a prescaler according to the second embodiment of the present invention.

A configuration example of the DIV is shown in FIG. 14A. And, an example of a timing of the prescaler 407 is shown in FIG. 14B. A division ratio of a dual modulus prescaler (prescaler 407), a division ratio of the programmable counter 408 and a division ratio of the swallow counter 409 are defined as (N+1)/N, P and M, respectively. When an output $V_{PRE}$ of the prescaler is counted for P times, an output $V_{DIV}$ of the programmable counter output changes LOW→HIGH. An output $V_M$ of the swallow counter becomes LOW for only M times from a clock next to a timing in which the $V_{DIV}$ becomes HIGH. While the $V_M$ is LOW, the prescaler performs frequency-division with a division ratio of (N+1) and when the $V_M$ returns to HIGH, the prescaler performs the frequency-division with the division ratio of N. In this case, the division ratio is given by a next expression.

$$\text{division ratio} = (N+1) \cdot M + N \cdot (P-M) = N \cdot P + M \quad (5)$$

Herein, M=0 to (N−1) and P>M are held. As a realistic example, N/(N+1)=4/5, P=38, M=0 to 3. In the example in FIG. 14B, the prescaler selects the frequency-division with the division ratio of 5 for three clocks after the $V_{DIV}$ becomes HIGH. In a case where the $V_{PRE}$ is used as a counter clock of the (PFD+TDC), since a cycle of the prescaler is determined uniquely by $V_{DCO}/4$ where the $V_{DCO}$ is the frequency of the DCO, it is preferable that the $V_{PRE}$ is used in a constant period of the frequency-division with the division ratio of 4. In concrete, it is preferable that comparison is made in a period just before the $V_{DIV}$ becomes HIGH. The phase relation between the $V_{REF}$ and the $V_{DIV}$ when the ADPLL is locked can be adjusted by the offset control 406 in a latter stage of the control logic 402 in FIG. 4.

Figure 15A:
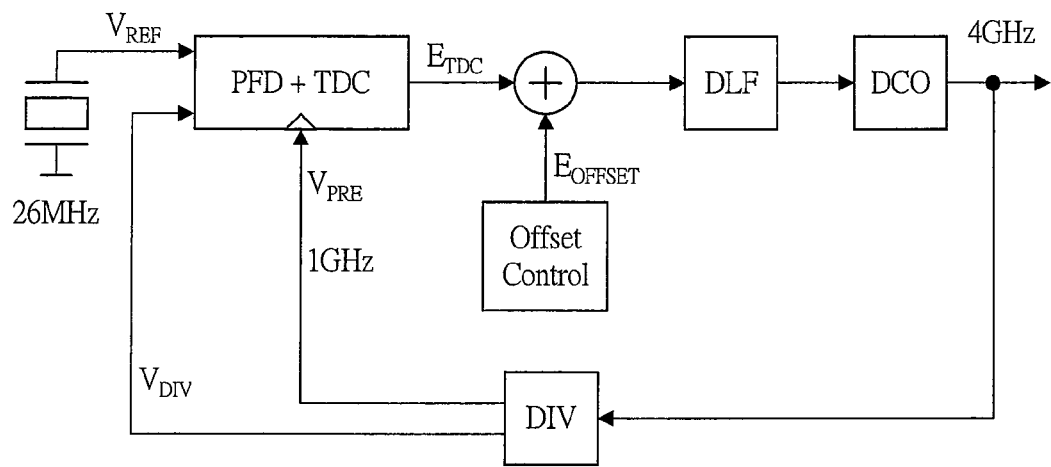
FIG. 15A is a diagram showing an adjustment method of a phase relation between the $V_{REF}$ and the $V_{DIV}$ when the ADPLL circuit is locked using an offset and showing a configuration example of the ADPLL according to the second embodiment of the present invention.
Figure 15B:
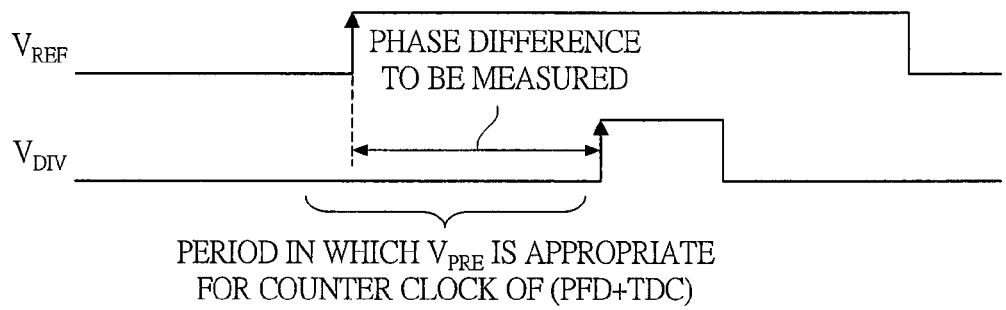
FIG. 15B is a diagram showing the adjustment method of the phase relation between the $V_{REF}$ and the $V_{DIV}$ when the ADPLL circuit is locked using the offset and showing the phase relation when $E_{OFFSET}<0$.
Figure 15C:
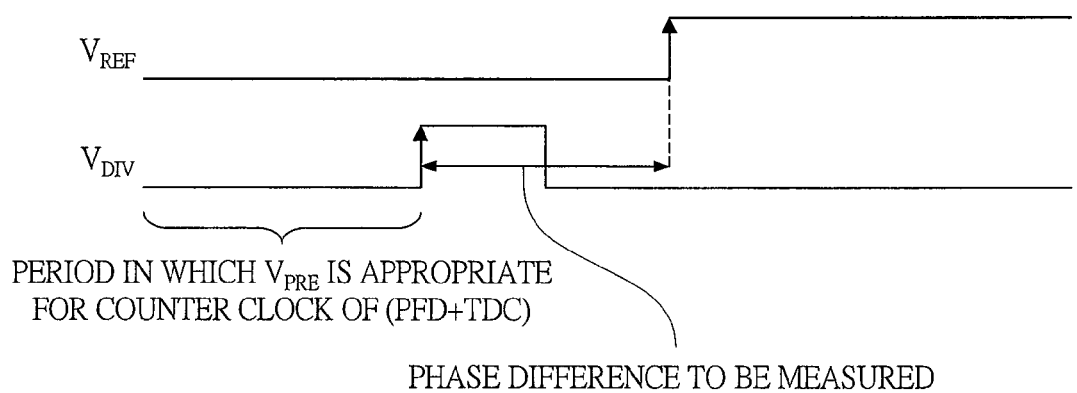
FIG. 15C is a diagram showing the adjustment method of the phase relation between the $V_{REF}$ and the $V_{DIV}$ when the ADPLL circuit is locked using the offset and showing the phase relation when $E_{OFFSET}>0$.

An adjustment method of the phase relation between the $V_{REF}$ and the $V_{DIV}$ using the offset when the ADPLL is locked is shown in FIGS. 15A, 15B and 15C. FIG. 15A shows a configuration example of the ADPLL, FIG. 15B shows the phase relation when $E_{OFFSET}<0$ and FIG. 15C shows the phase relations when $E_{OFFSET}>0$.

When the ADPLL is locked, negative feedback control is performed so that an input of the DLF becomes 0. When the $E_{OFFSET}$ is negative as shown in FIG. 15B, the $E_{TDC}$ is locked by a signal having the same magnitude and an inversed sign. In this case, the $V_{DIV}$ is delayed with respect to the $V_{REF}$.

On the other hand, when the $E_{OFFSET}$ is positive as shown in FIG. 15C, the $E_{TDC}$ is locked by a signal having the same magnitude and an inversed sign. In this case, the $V_{DIV}$ is advanced with respect to the $V_{REF}$. It is FIG. 15B in which the phase difference to be measured and a period suitable for the the counter clock of the (PFD+TDC) correspond with each other, and it is preferable that the phases are adjusted in this manner.

Figure 16A:
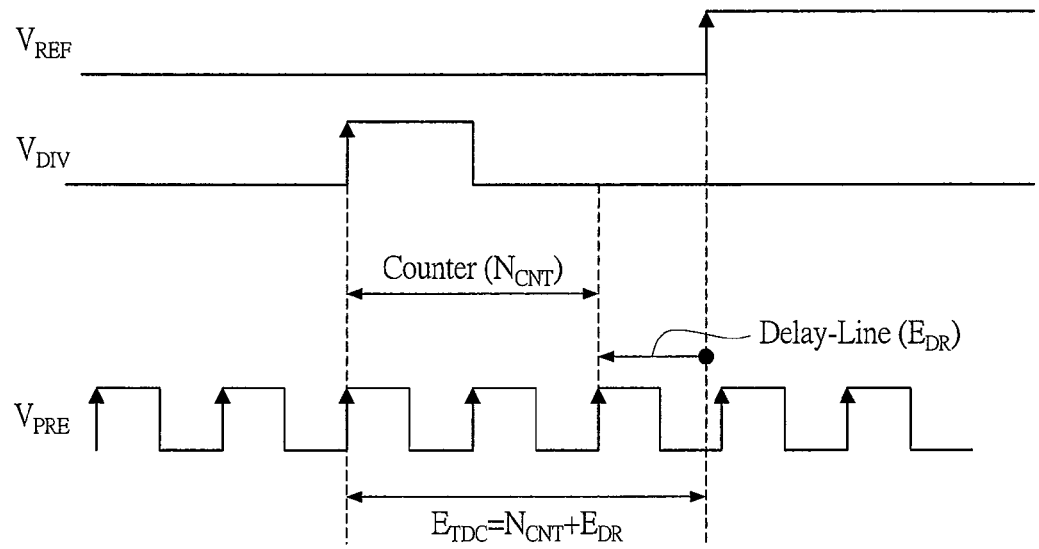
FIG. 16A is a diagram showing a timing chart when the $V_{REF}$ goes beyond the $V_{DIV}$ and the phase difference is measured at the rising edge according to the second embodiment of the present invention.
Figure 16B:
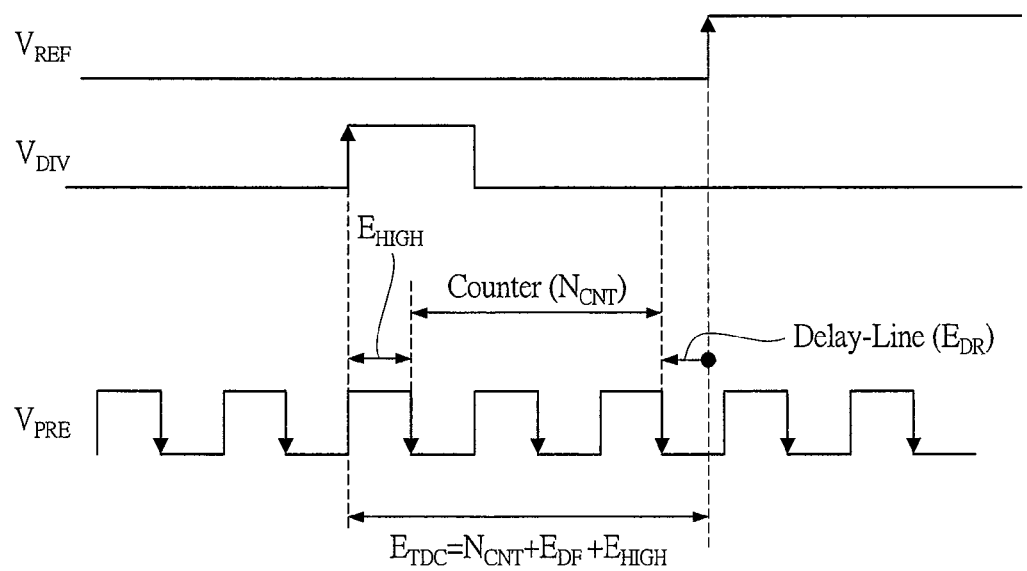
FIG. 16B is a diagram showing a timing chart when the $V_{REF}$ goes beyond the $V_{DIV}$ and the phase difference is measured at the falling edge according to the second embodiment of the present invention.

Timing charts in a case where the $V_{REF}$ is delayed with respect to the $V_{DIV}$ are shown in FIGS. 16A and 16B. FIG. 16A shows a case in which the phase difference is measured at the rising edge, and FIG. 16B shows a case in which the phase difference is measured at the falling edge.

As show in FIG. 16A, the phase difference in the case where the phase difference is measured at the rising edge is obtained by a following expression.

$$E_{TDC} = N_{CNT} + E_{DR} \quad (6)$$

As show in FIG. 16B, the phase difference in the case where the phase difference is measured at the falling edge is obtained by a following expression.

$$E_{TDC} = N_{CNT} + E_{DR} + E_{HIGH} \quad (7)$$

Herein, the $E_{HIGH}$ is a period of HIGH of the $V_{PRE}$, and if the duty ratio is 50%, it becomes 0.5.

As is understood from the expressions (3), (4), (6) and (7), in the phase relation between the $V_{REF}$ and the $V_{DIV}$, the calculation expression is changed. The phase relation is obtained by a polarity judgment signal POL in FIG. 35. Although the calculation expression may be changed according to the POL, the DCO built in the RF-IC usually has a plurality of oscillation bands, and automatically selects one of them before transiting to the phase lock processing. Even if a frequency is switched, control can be performed so that the phase does not pass 0 and does not change greatly (refer to Patent Document 1)

Figure 17:
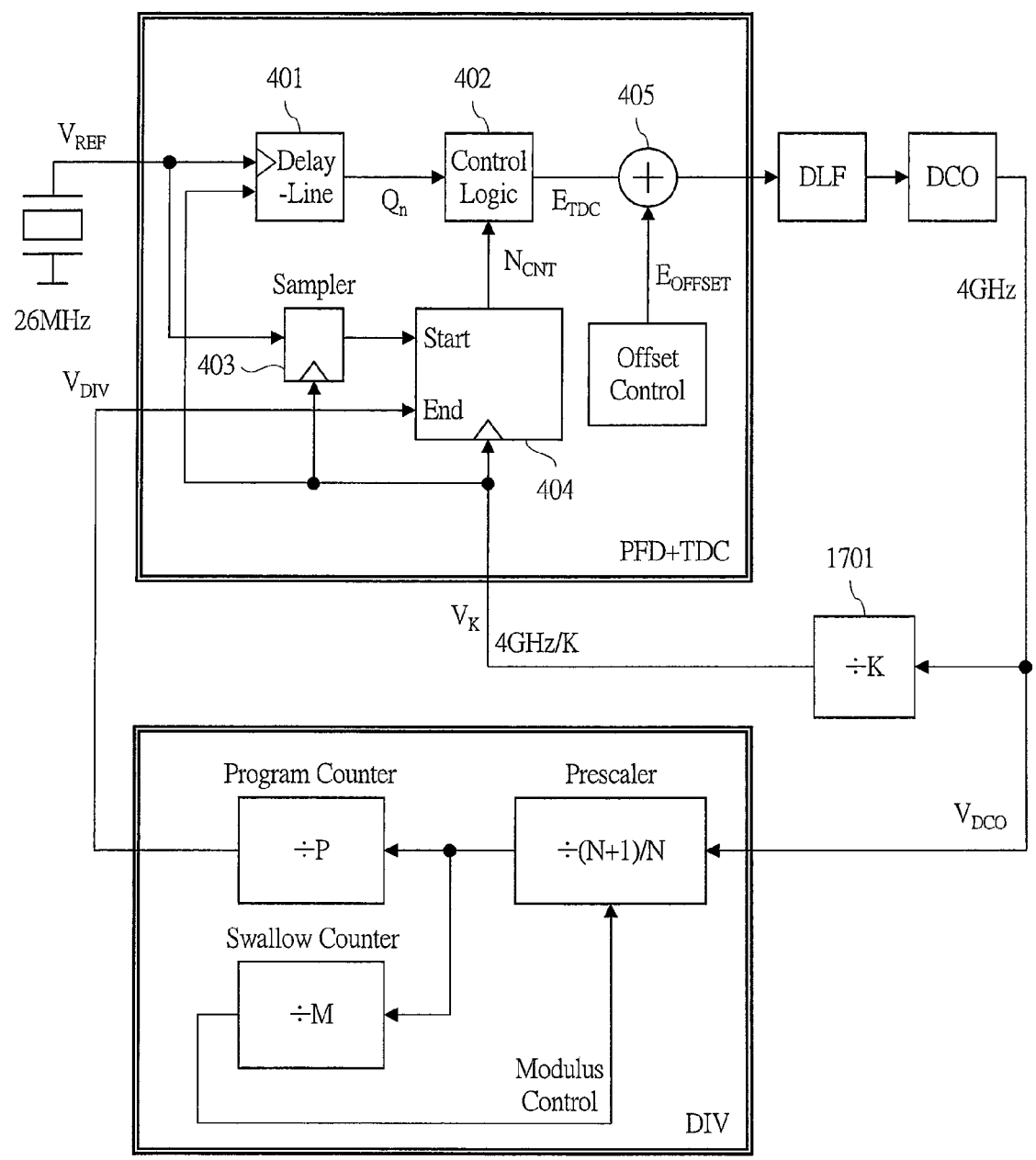
FIG. 17 is a block diagram showing a modified example 1 of the ADPLL according to the second embodiment of the present invention.

FIG. 17 is a block diagram showing a modified example 1 of the ADPLL according to the second embodiment of the present invention.

In the modified example 1, a divider 1701 is added to the output of the DCO, and this clock can be used as the clock of the counter 404 of the (PFD+TDC). In this case, a consumption current and an area of the divider 1701 and the number of the counters in the (PFD+TDC) increase, but an area of the delay-line 401 can be reduced. And, since the division ratio can be determined independently from the prescaler, a degree of freedom of design is increased.

Figure 18:
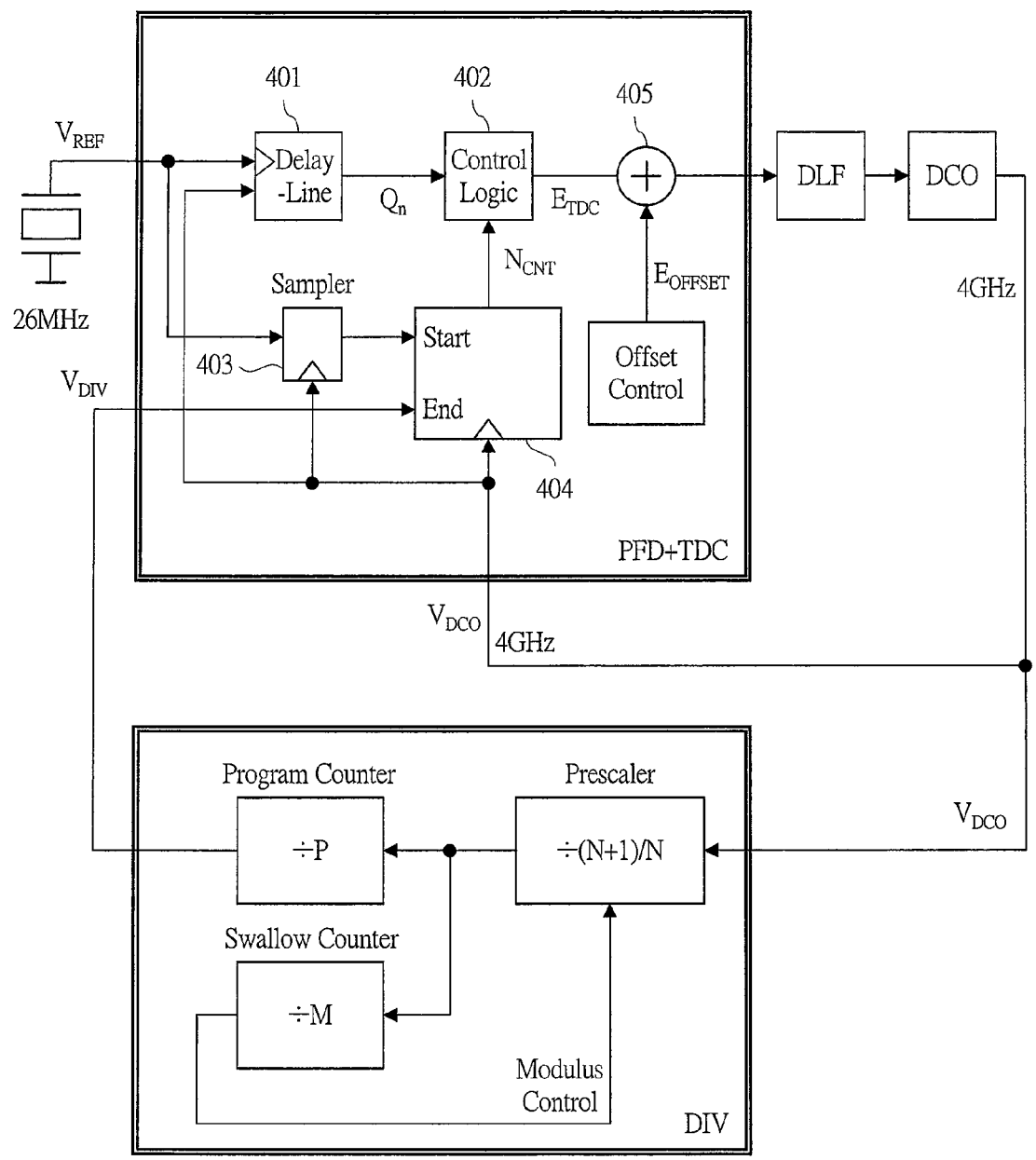
FIG. 18 is a block diagram showing a modified example 2 of the ADPLL according to the second embodiment of the present invention.

FIG. 18 is a block diagram showing a modified example 2 of the ADPLL according to the second embodiment of the present invention.

As shown in FIG. 18, a case in which the divider is eliminated completely can be considered. Although the number of the counters in the (PFD+TDC) increases, the area of the delay-line 401 can be largely reduced.

As explained above, in the ADPLL according to the second embodiment, the (PFD+TDC) is composed of the counter roughly measuring the phase difference in a wide range, and the delay-line measuring the slight phase difference between them with high precision.

Therefore, according to the ADPLL of the second embodiment of the present invention, the resolution, the detection range, the linearity, the occupation area and the phase difference detection in the vicinity of the phase difference of 0 can be improved.

Third Embodiment

In the second embodiment, in the explanations of FIG. 4, FIG. 17 and FIG. 18, an explanation that the phase difference is measured by the counter and remaining factors are measured by the delay-line is made. In a third embodiment, explanations are made from a different viewpoint.

Since the signal of the $V_{DIV}$ completely synchronizes with the output of the DCO or the output of the divider having an input of the output of the DCO, the phase can be converted into digital in an integral multiple of the output of the DCO or the output of the divider having the input of the output of the DCO. On the other hand, since the $V_{REF}$ does not synchronize with the output of the DCO or the output of the divider having the input of the output of the DCO, the phase cannot be converted into digital in an integral multiple thereof, and accordingly, a certain phase (time) difference occurs. It can be considered that the difference is expressed by the delay-line. That is, operation of this ADPLL can be considered to be equivalent to respectively converting the $V_{DIV}$ and the $V_{REF}$ to digital phases by the output of the DCO or the output of the divider having the input of the output of the DCO and taking difference between them.

Figure 19:
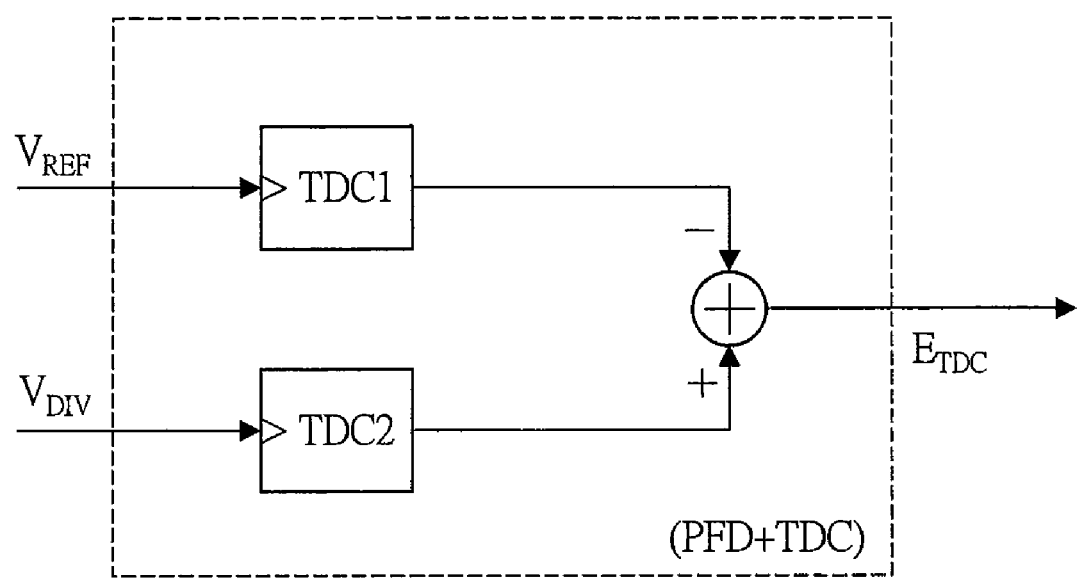
FIG. 19 is a diagram showing a concept of (PFD+TDC) according to a third embodiment of the present invention.

FIG. 19 shows a concept of a (PFD+TDC) according to the third embodiment.

As shown in FIG. 19, phases of the $V_{DIV}$ and the $V_{REF}$ are converted into digital by the TDC respectively, and the phase difference is obtained by subtraction of the phases. In comparison with a method of converting the phase difference into digital, the detection of the phase difference in the vicinity of 0 is fundamentally improved. Note that, also in this method, it is necessary to change calculation expressions between the case in which the $V_{REF}$ goes ahead the $V_{DIV}$ and the case in which the $V_{REF}$ goes beyond the $V_{DIV}$. Details are shown below.

Figure 20A:
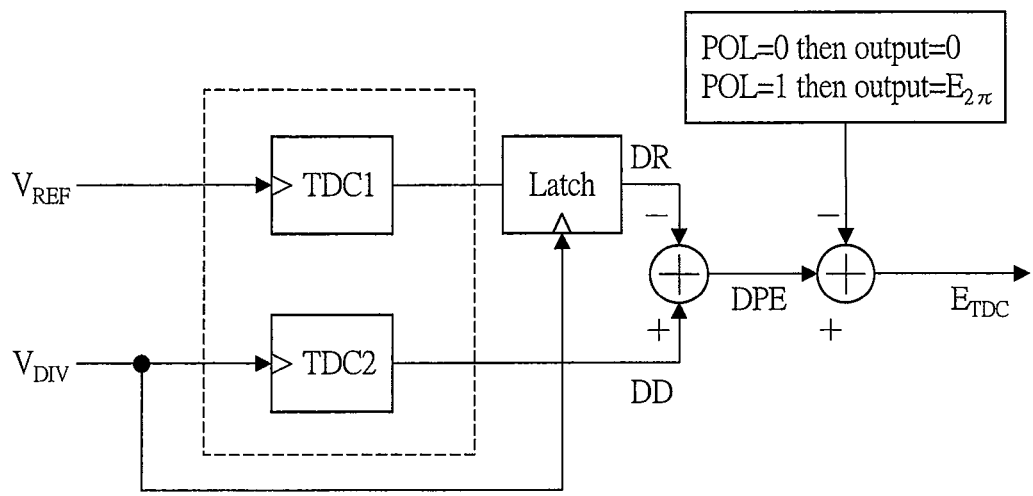
FIG. 20A is a diagram showing a configuration example of a TDC and showing a case in which a result of a TDC1 is sampled at the rising of the $V_{DIV}$ according to the third embodiment of the present invention.
Figure 20B:
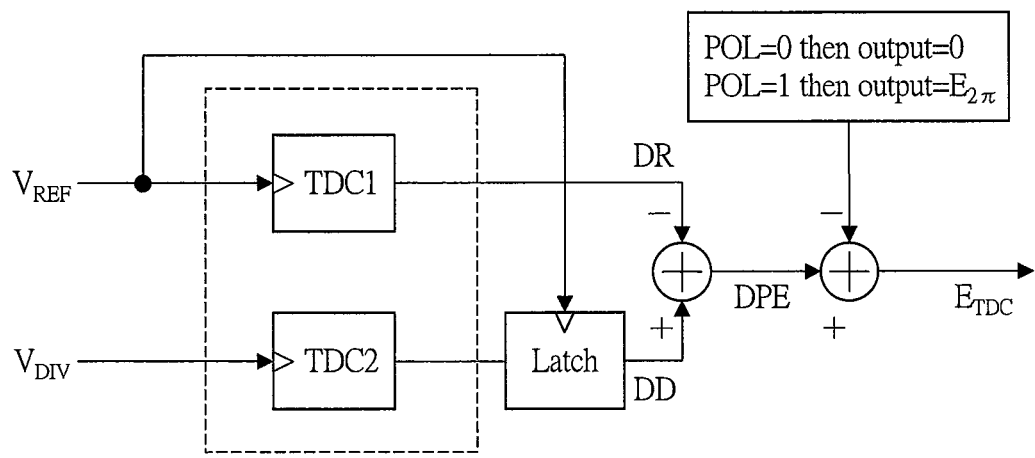
FIG. 20B is a diagram showing the configuration example of the TDC and showing a case in which a result of a TDC2 is sampled at the rising of the $V_{REF}$ according to the third embodiment of the present invention.

Configuration examples of TDCs according to the third embodiment is shown in FIGS. 20A and 20B. FIG. 20A shows a case in which a result of a TDC1 is sampled at the rising of the $V_{DIV}$, and, FIG. 20B shows a case in which a result of a TDC2 is sampled at the rising of the $V_{REF}$.

In this configuration, an output of one of TDCs is sampled by a clock of the other one. The output of the TDC is necessary to synchronize with a clock of the DLPF, and is synchronized with one of the $V_{REF}$ and the $V_{DIV}$. As an example, a case of FIG. 20A is explained.

Figure 21A:
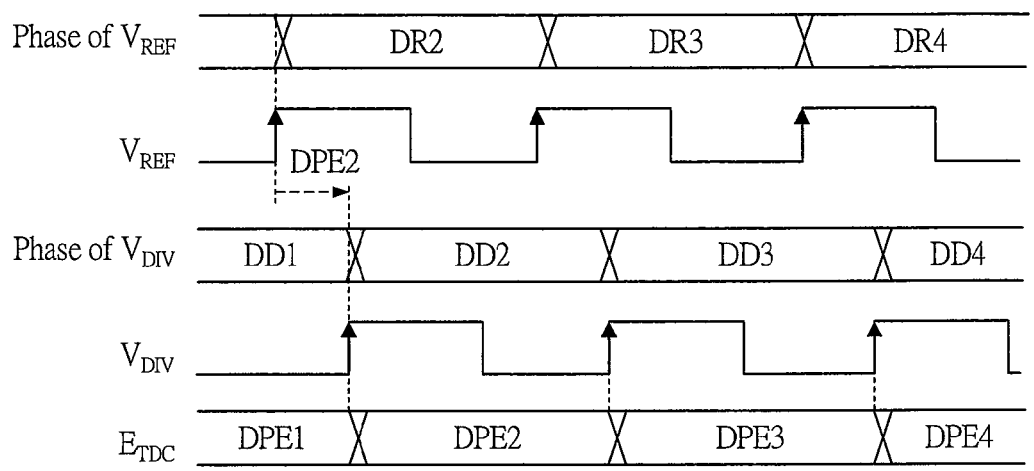
FIG. 21A is a diagram showing a timing chart of FIG. 20A and showing a case in which the $V_{DIV}$ goes beyond the $V_{REF}$ according to the third embodiment of the present invention.
Figure 21B:
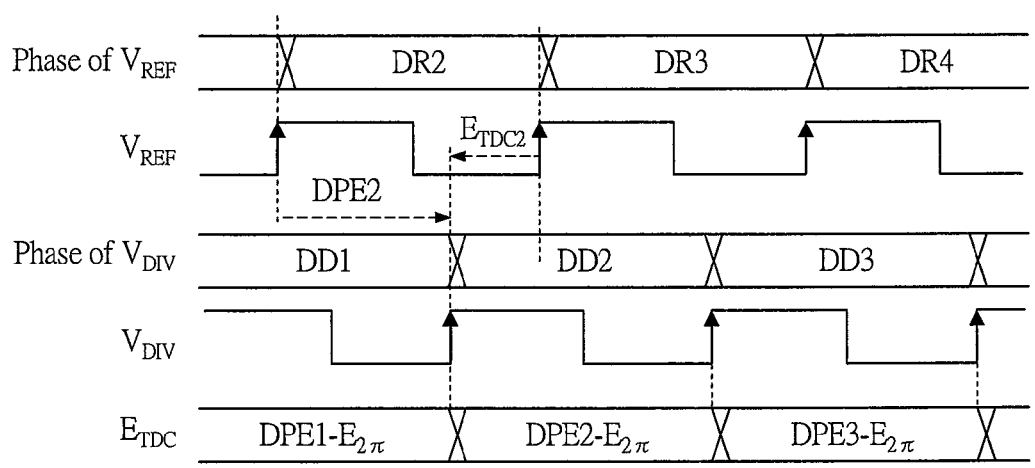
FIG. 21B is a diagram showing the timing chart of FIG. 20A and showing a case in which the $V_{DIV}$ goes ahead the $V_{REF}$ according to the third embodiment of the present invention.

Timing charts of FIG. 20A are shown in FIGS. 21A and 21B. FIG. 21A shows the case in which the $V_{DIV}$ goes beyond the $V_{REF}$ and FIG. 21B shows the case in which the $V_{DIV}$ goes ahead the $V_{REF}$.

Calculation expressions are changed between the case in which the $V_{REF}$ goes ahead the $V_{DIV}$ and the case in which the $V_{REF}$ goes beyond the $V_{DIV}$. The phase relation is determined by the polarity judgment signal POL in FIG. 35.

If the $V_{DIV}$ goes beyond the $V_{REF}$, $$E_{TDC}=DPE[n]=Div[n]-Ref[n-1]. \quad (8)$$

If the $V_{DIV}$ goes ahead the $V_{REF}$, $$E_{TDC}=DPE[n]-E_{2\pi}=Div[n]-Ref[n-1]-E_{2\pi} \quad (9)$$

Herein, the $E_{2\pi}$ is a value obtained by converting $2\pi$ into a digital code.

Figure 22:
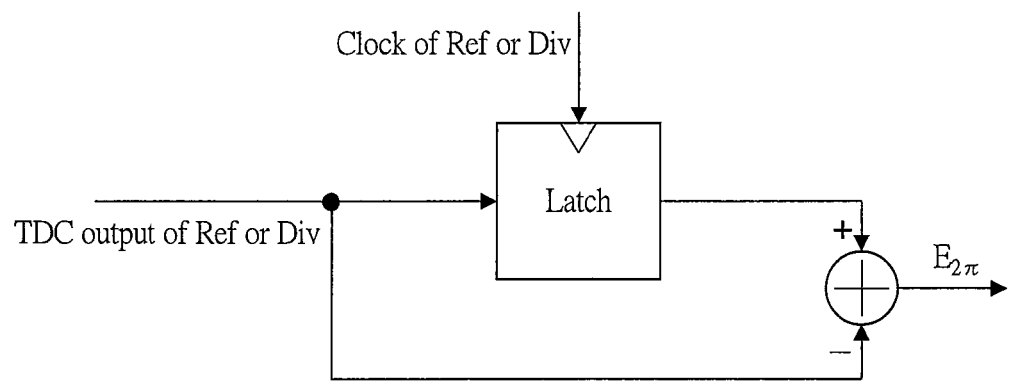
FIG. 22 is a diagram showing a circuit example of a $2\pi$ detector digital converter converting a value of $2\pi$ into a digital code according to the third embodiment of the present invention.

A circuit example of a $2\pi$ detector digital converter converting a value of $2\pi$ into the digital code is shown in FIG. 22.

A digital value of $2\pi$ is obtained by subtraction of a phase obtained by digital conversion by the TDC and a phase one clock before held by a latch.

Figure 23:
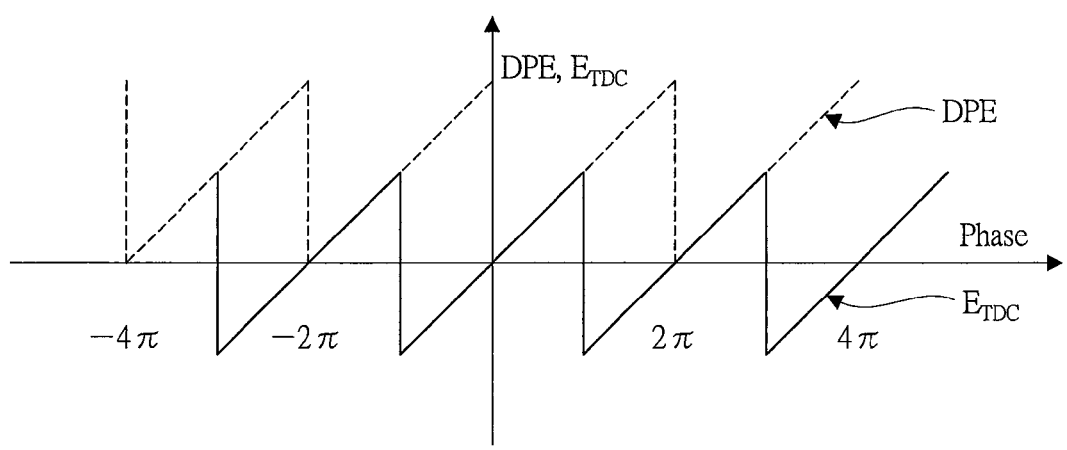
FIG. 23 is a diagram showing an input/output characteristic of the TDC according to the third embodiment of the present invention.

An input/output characteristic of the TDC is shown in FIG. 23. A characteristic of the DPE not using the calculation expressions (8) and (9) is shown in a dotted line and a characteristic of the $E_{TDC}$ using the calculation expressions are shown in a solid line. The $E_{TDC}$ becomes stable with value 0 when an input phase difference is 0, $\pm 2\pi$, . . . and the ADPLL is locked. Matters described above are true in a case of FIG. 20B.

Figure 24A:
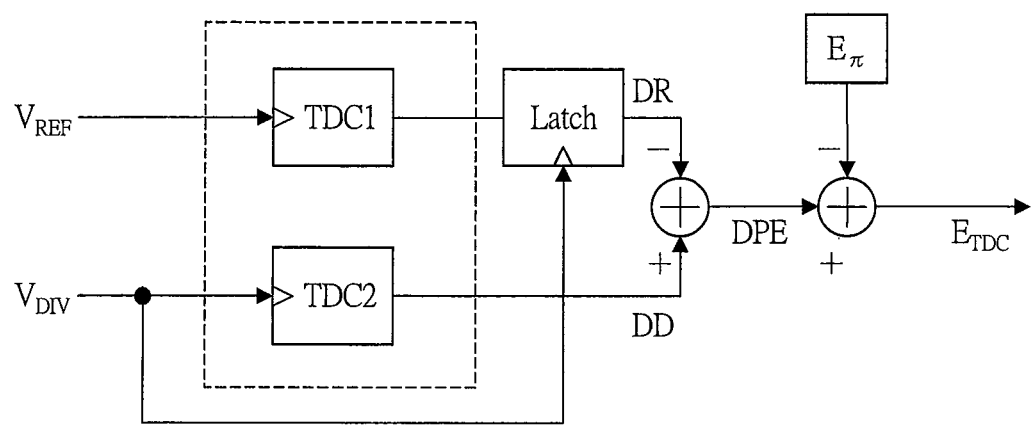
FIG. 24A is a block diagram showing a modified example 1 of the TDC according to the third embodiment of the present invention.
Figure 24B:
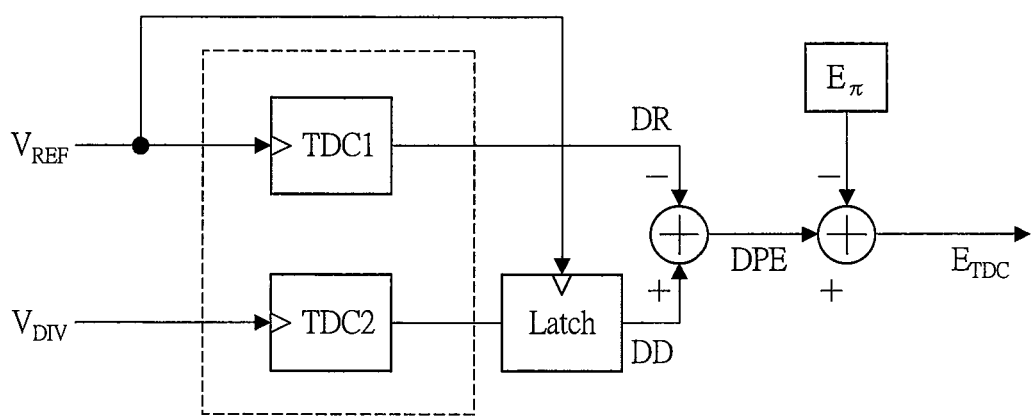
FIG. 24B is a block diagram showing the modified example 1 of the TDC according to the third embodiment of the present invention.

FIGS. 24A and 24B show a modified example 1 of the TDC according to the third embodiment.

In this configuration, $-E_\pi$ is always subtracted with respect to the DPE. The phases of the $V_{REF}$ and the $V_{DIV}$ to be locked are displaced by $\pi$ and case distinction of a calculation expression is deleted. Herein, $E_\pi$ is a value obtained by converting $\pi$ into a digital code. The $2\pi$ detector digital converter in FIG. 22 can be used for obtaining the $E_\pi$, and the $E_\pi$ can be obtained by shifting a result thereof to right by one bit (multiplying by ½).

Figure 25:
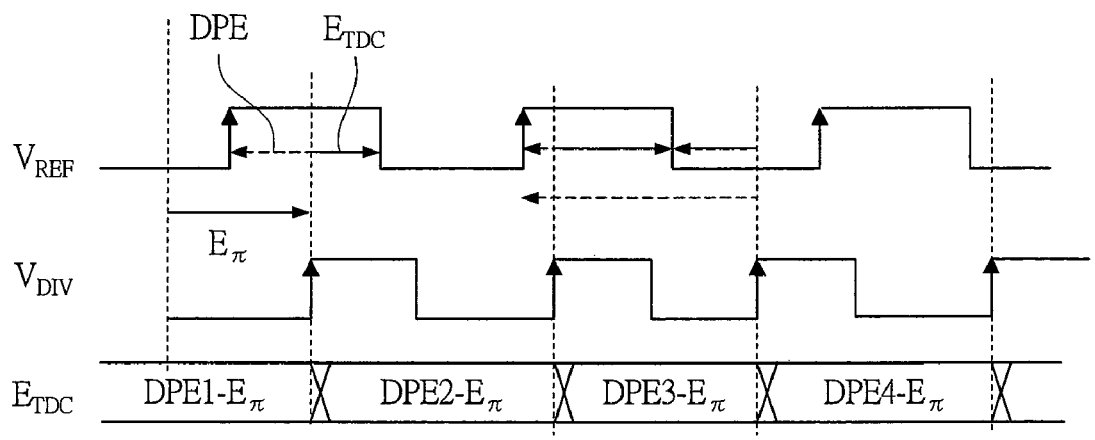
FIG. 25 is a block diagram showing the modified example 1 of the TDC according to the third embodiment of the present invention.

A timing chart of FIG. 24A is shown in FIG. 25. The $E_{TDC}$ is shown in a solid line, and the DPE is shown in a dashed line.

Figure 26:
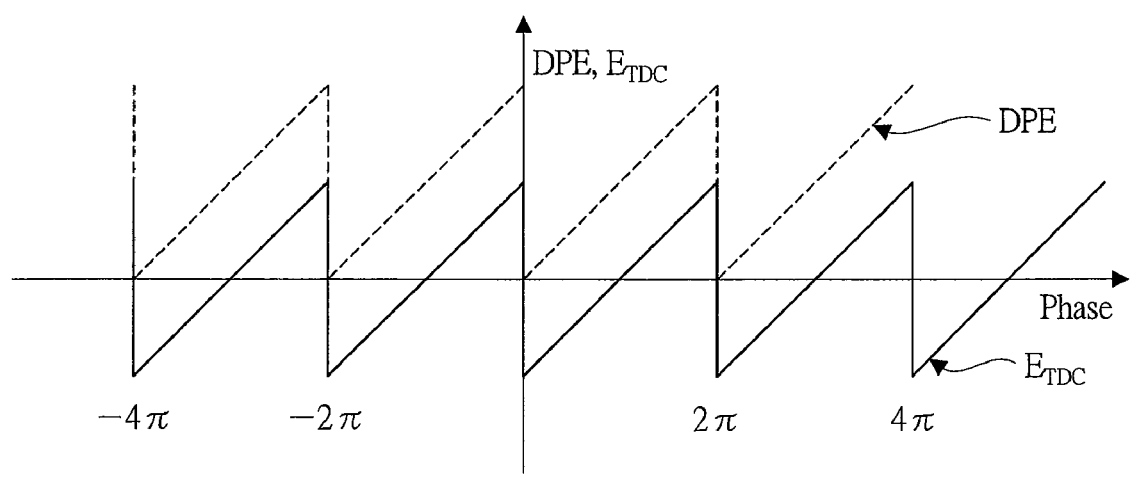
FIG. 26 is a diagram showing the input/output characteristic of the TDC according to the third embodiment of the present invention.

The input/output characteristic of the TDC is shown in FIG. 26.

A characteristic of the DPFD in which the $E_\pi$ is not subtracted is shown by a dotted line, and a characteristic of the ETDC in which the $E_\pi$ is subtracted is shown by a solid line. The ETDC becomes stable with value 0 when the input phase difference is $\pm\pi$, . . . and the ADPLL is locked. Matters described above are true in a case of FIG. 24B.

In the foregoing, the case in which the phase differences are different is explained with reference to FIG. 20A of the third embodiment and FIG. 21A of the modified example 1.

Figure 27A:
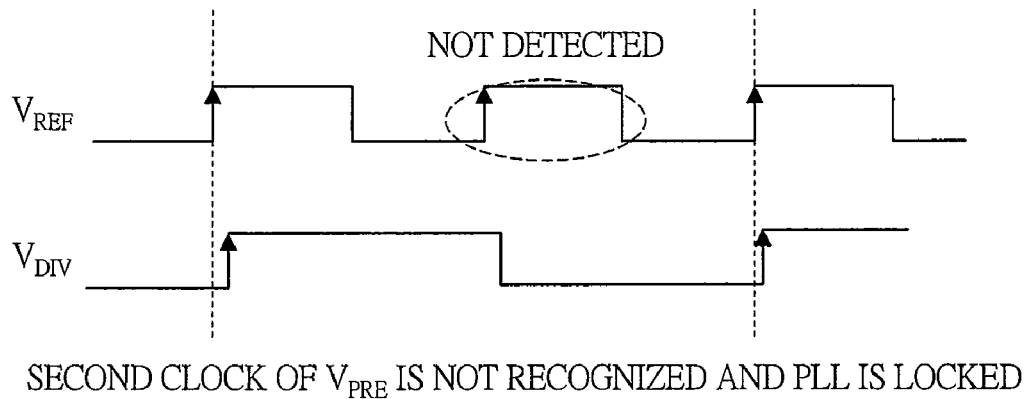
FIG. 27A is a diagram showing a timing chart in a case where frequencies are different and a frequency of the $V_{DIV}$ is ½ of a frequency of the $V_{REF}$ according to the third embodiment of the present invention.
Figure 27B:
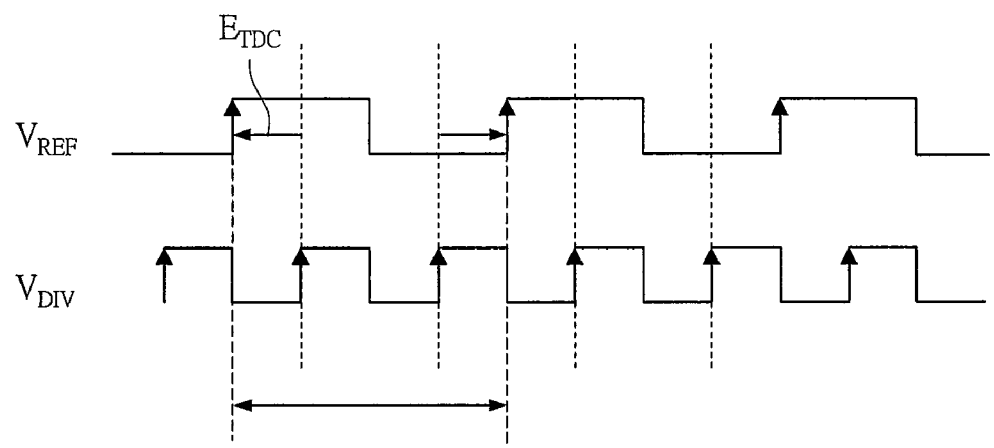
FIG. 27B is a diagram showing a timing chart in the case where the frequencies are different and the frequency of the $V_{DIV}$ is 2 times of the frequency of the $V_{REF}$ according to the third embodiment of the present invention.
Figure 28:
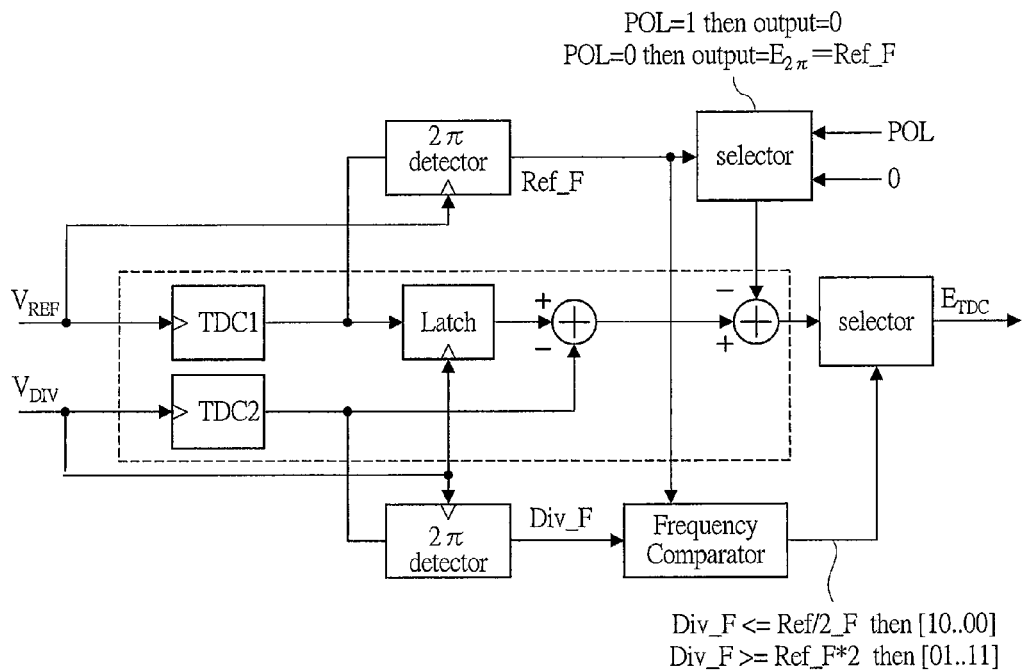
FIG. 28 is a diagram showing a configuration example of the TDC in FIG. 20A having a frequency judgment device added according to the third embodiment of the present invention.
Figure 29:
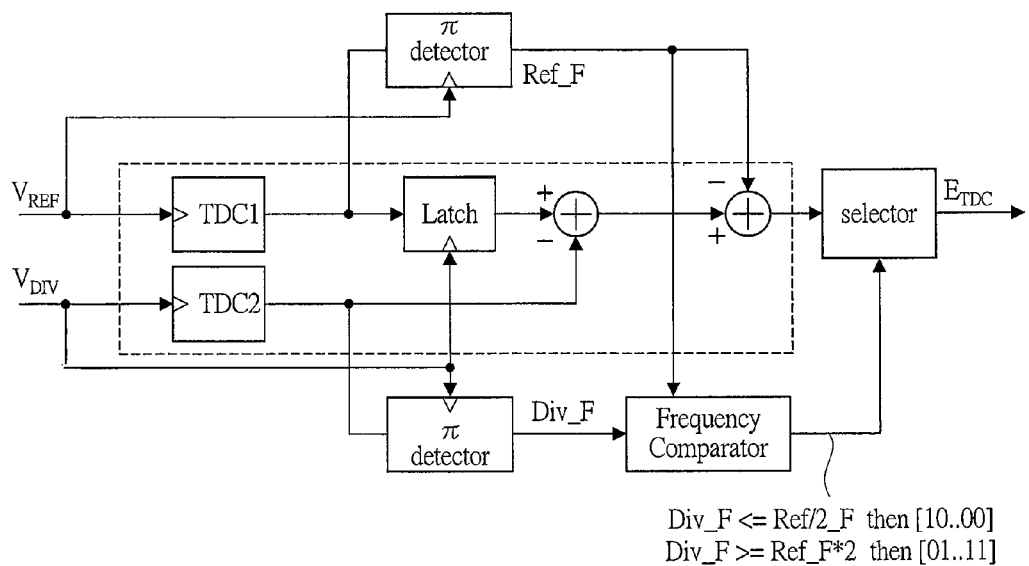
FIG. 29 is a diagram showing a configuration example of the TDC in FIG. 24A having the frequency judgment device added according to the third embodiment of the present invention.

Next, with reference to FIGS. 27A and 27B, a case in which frequencies are different is explained. FIG. 28 and FIG. 29 are diagrams showing configurations of TDCs having frequency judgment devices added in the third embodiment. FIG. 28 shows a TDC in FIG. 20A having a frequency judgment device added and FIG. 29 shows a TDC in FIG. 24A having a frequency judgment device added.

(a) A case in which the frequency of the $V_{DIV}$ is ½ of the frequency of the $V_{REF}$ If a phase in a $V_{REF}$ side is updated before data is taken in by the $V_{DIV}$, frequencies and phases cannot be adjusted precisely. In this case, the ADPLL is locked in a frequency of ½ of the frequency of the $V_{REF}$, therefore, it cannot be used.

(b) A case in which the frequency of the $V_{DIV}$ is two times of the frequency of the $V_{REF}$ Since the $V_{DIV}$ can also lock to two times of the frequency of the $V_{REF}$, it cannot be used.

Therefore, a frequency detector is necessary. When it is detected that the frequency becomes a frequency that cannot be used, the $E_{TDC}$ is fixed to a constant value. The frequency is in inverse proportion to an output of the $2\pi$ detector digital converter in FIG. 22. If the frequency is high, since resolution is constant, the output of the $2\pi$ detector digital converter is decreased. For example, definitions are made as below.

$$Div\_F \leq Ref\_F/2 \quad (1)$$

$$E_{TDC}=[1\_0000\_\ldots\_00] \text{ (maximum negative value in digital)} \quad (10)$$

$$\text{Div\_F} \geq \text{Ref\_F} \cdot 2 \quad (2)$$

$$E_{TDC} = [0\_11 \ldots 11] \text{ (maximum positive value in digital)} \quad (11)$$

Herein, the Div_F and the Ref_F are outputs of 2π detector digital converters of the $V_{DIV}$ and $V_{REF}$, respectively.

Note that, the DCO built in the RF-IC usually has a plurality of oscillation bands, and automatically selects one of them before transiting to the phase lock processing. Accordingly, great change does not occur in a phase and a frequency (see Patent Document 1). Therefore, in this case, the frequency judgment device mentioned above is unnecessary. Note that, this argument is true in FIG. 20B and FIG. 21B.

As explained above, in the third embodiment, the phases of the $V_{DIV}$ and the $V_{REF}$ are digitally converted by the TDCs respectively, and the phase difference is obtained by subtracting the phases. Thereby, in comparison with the method of converting the phase difference into a digital value, the detection of the phase difference in the vicinity of 0 is fundamentally improved.

Fourth Embodiment

In a fourth embodiment, application examples of the ADPLL according to the first to the third embodiments are explained.

Figure 30:
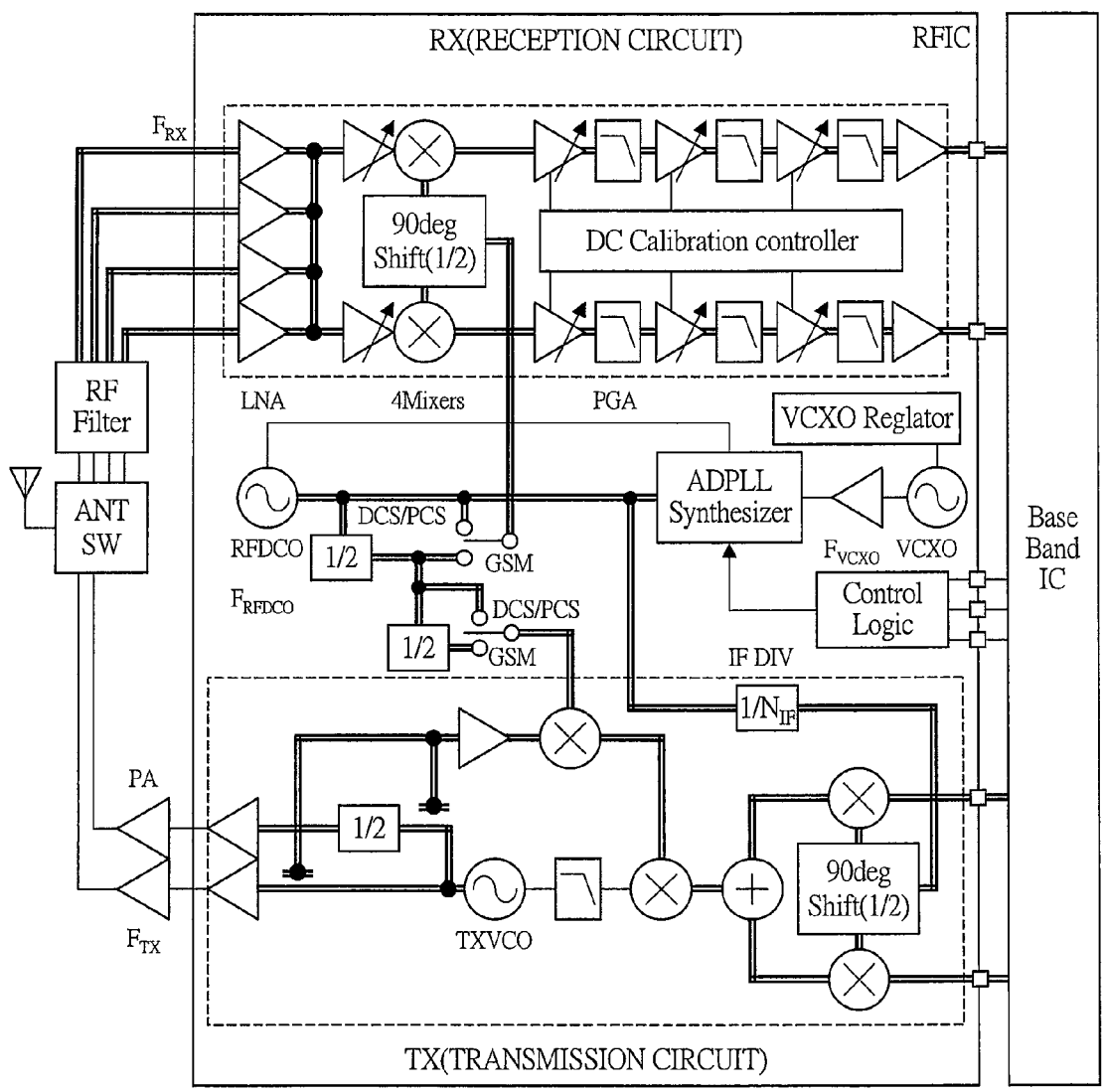
FIG. 30 is a block diagram showing a configuration of a transmission and reception RF-IC (BRIGHT) for a European digital cellular system GSM according to a fourth embodiment of the present invention.

FIG. 30 is a block diagram showing a configuration of a transmission and reception RF-IC (BRIGHT) for the European digital cellular system GSM.

The BRIGHT in FIG. 30 adopts a direct conversion method for reception and an offset PLL method for transmission. As a local oscillator, an ADPLL frequency synthesizer may be adopted.

Figure 31:
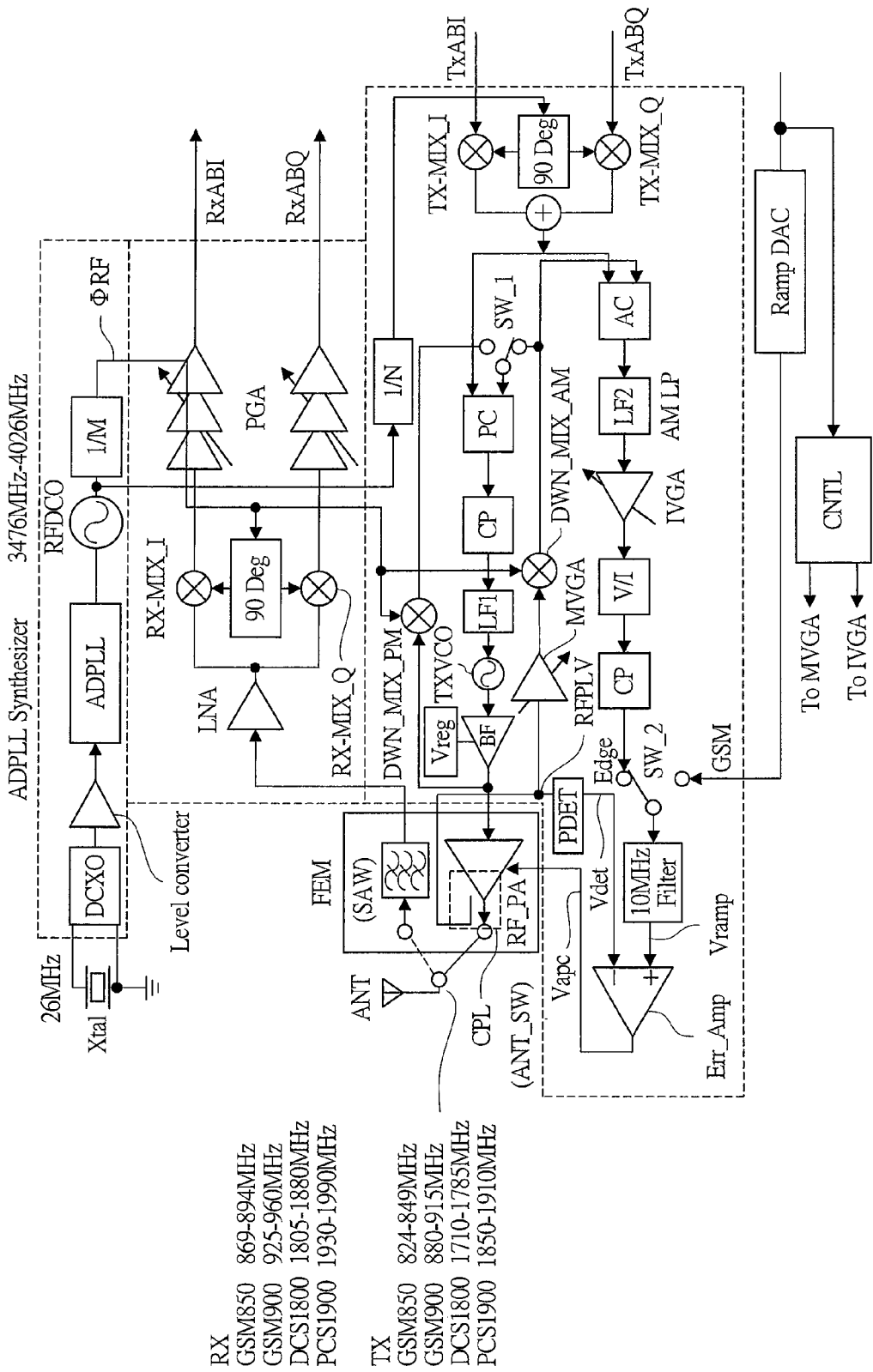
FIG. 31 is a block diagram showing a configuration of a transmission and reception RF-IC (BRIGHT) for a European digital cellular system EDGE according to a fourth embodiment of the present invention.

FIG. 31 is a block diagram showing a configuration of a transmission and reception RF-IC (BRIGHT) for the European digital cellular system EDGE.

The BRIGHT in FIG. 31 adopts the direct conversion method for reception and a polar loop method for transmission. As the local oscillator, the ADPLL frequency synthesizer may be adopted.

Figure 32:
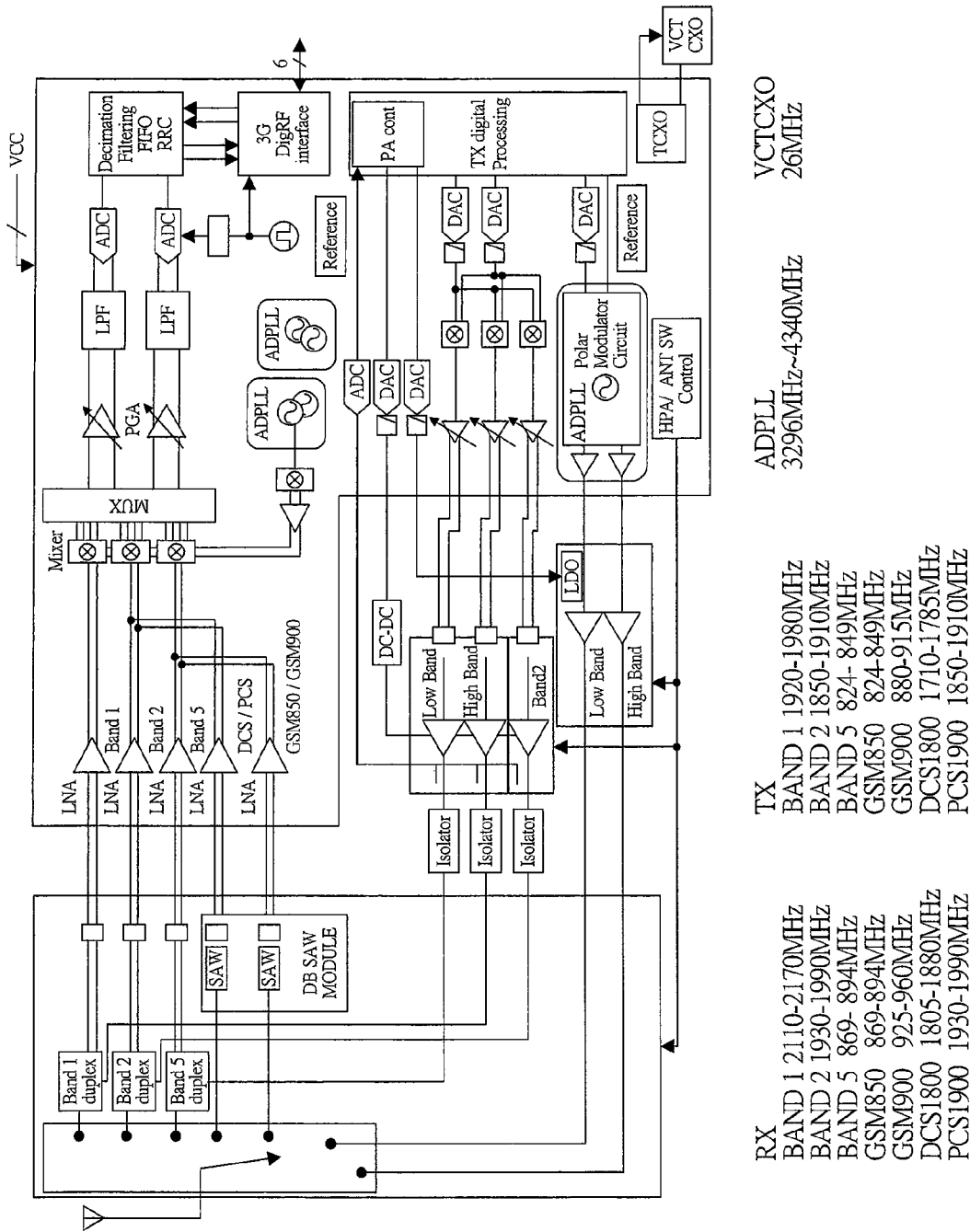
FIG. 32 is a block diagram showing a configuration of a transmission and reception RF-IC (BRIGHT) for a European digital cellular system EDGE/WCDMA according to a fourth embodiment of the present invention.
Figure 33:
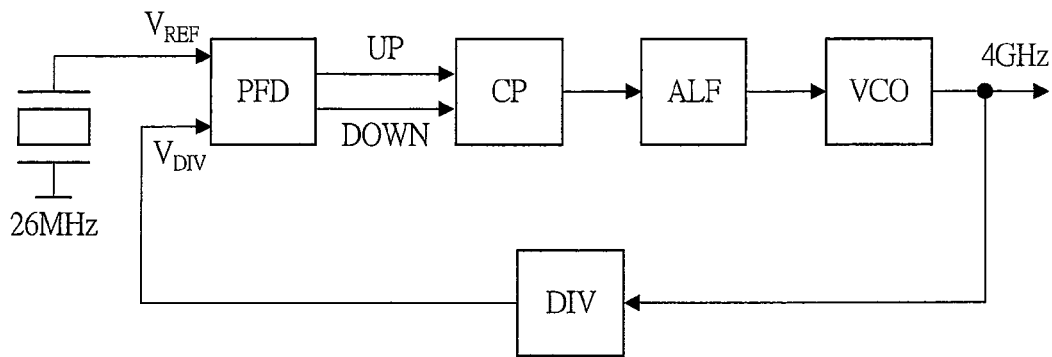
FIG. 33 is a block diagram showing a configuration example of a PLL examined as a premise of the present invention.
Figure 34:
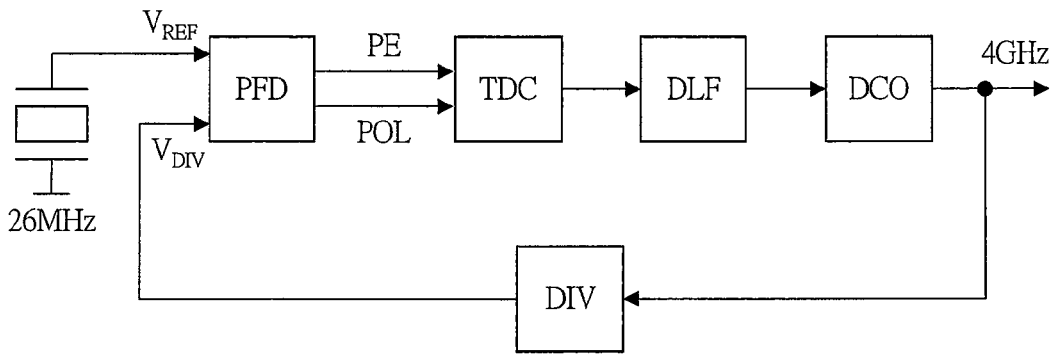
FIG. 34 is a block diagram showing a configuration example of an ADPLL examined as a premise of the present invention.

FIG. 32 is a block diagram showing a configuration of a transmission and reception RF-IC (BRIGHT) for the European digital cellular system EDGE/WCDMA.

The BRIGHT in FIG. 32 adopts the direct conversion method for reception in both of the EDGE and the WCDMA. In transmission of the WCDMA, the direct conversion method is adopted and in transmission of the EDGE, the polar modulation method consisting of a phase modulation path directly modulating the ADPLL and an amplitude modulation path. As the local oscillator for reception of the EDGE/WCDMA and transmission of the WCDMA, the ADPLL frequency synthesizer is adopted. And, the ADPLL is adopted for phase modulation of the transmission of the EDGE (see Non-Patent Document 4).

In the foregoing, the invention made by the inventors of the present invention has been concretely described based on the embodiments. However, it is needless to say that the present invention is not limited to the foregoing embodiments and various modifications and alterations can be made within the scope of the present invention. And, the first to the third embodiments may be appropriately combined, respectively.

The present invention can be applied widely to the RF-IC for wireless LAN and other PLL frequency synthesizers.

What is claimed is:

1. A PLL circuit configured by a feedback loop comprising:
a phase frequency detector making comparison of phases and frequencies of a reference signal and a feedback signal;
a time to digital converter converting an output of the phase frequency detector into a digital value;
a digital loop filter removing a high frequency noise component from an output of the time to digital converter;
a digitally controlled oscillator controlled based on an output of the digital loop filter; and
a divider frequency-dividing an output of the digitally controlled oscillator and outputting the feedback signal,
wherein an offset value is added at any portion of the feedback loop, a phase of the feedback signal is controlled and a value other than 0 is inputted to the time to digital converter even when the PLL circuit is locked.

2. The PLL circuit according to claim 1,
wherein the time to digital converter comprises:
a first delay device having a first delay time; and
a plurality of second delay devices connected in latter stages of the first delay device and having second delay times shorter than the first delay time.

3. A PLL circuit configured by a feedback loop including:
phase detecting or frequency detecting and time-to-digital converting equipment making comparison of phases and frequencies of a reference signal and a feedback signal and converting a result of the comparison into a digital value;
a digital loop filter removing a high frequency noise component from an output of the phase detecting or frequency detecting and time-to-digital converting equipment;
a digitally controlled oscillator controlled based on an output of the digital loop filter; and
a divider frequency-dividing an output of the digitally controlled oscillator and outputting the feedback signal,
wherein the phase detecting or frequency detecting and time-to-digital converting equipment comprises:
a counter measuring a phase difference between the reference signal and the feedback signal with first precision; and
a delay-line measuring the phase difference between the reference signal and the feedback signal with second precision finer than the first precision.

4. The PLL circuit according to claim 3,
wherein the divider comprises:
a first divider frequency-dividing the output of the digitally controlled oscillator and outputting a clock signal; and
a second divider frequency-dividing an output of the first divider and outputting the feedback signal,
wherein the clock signal is inputted as a clock of the counter.

5. The PLL circuit according to claim 3, further comprising:
a third divider frequency-dividing the output of the digitally controlled oscillator and outputting a clock signal,
wherein the clock signal is inputted as a clock of the counter.

6. The PLL circuit according to claim 3,
wherein the output of the digitally controlled oscillator is inputted as a clock of the counter.

7. The PLL circuit according to claim 3, further comprising:
a function of avoiding an error in combining phase differences of the counter and the delay-line by always measuring phase differences in at least two paths and adopting a phase difference judged to be no problem from a value of the delay-line.

8. The PLL circuit according to claim 4,
wherein the phase detecting or frequency detecting and time-to-digital converting equipment further comprises:
control logic obtaining the phase difference based on measurement results of the counter and the delay-line; and
an offset circuit provided at a latter stage of the control logic, and
wherein a phase relation when the PLL circuit is locked is adjusted and phase comparison operation can be carried out in a period when a division ratio of the first divider is constant.

9. A PLL circuit configured by a feedback loop comprising:
phase detecting or frequency detecting and time-to-digital converting equipment making comparison of phases and frequencies of a reference signal and a feedback signal and converting a result of the comparison into a digital value;
a digital loop filter removing a high frequency noise component from an output of the phase detecting or frequency detecting and time-to-digital converting equipment;
a digitally controlled oscillator controlled based on an output of the digital loop filter; and
a divider frequency-dividing an output of the digitally controlled oscillator and outputting the feedback signal,
wherein the phase detecting or frequency detecting and time-to-digital converting equipment comprises:
a first circuit converting a phase of the reference signal into digital;
a second circuit converting a phase of the feedback signal into digital; and
a subtractor obtaining a difference between outputs of the first circuit and the second circuit.

10. The PLL circuit according to claim 9,
wherein the phase detecting or frequency detecting and time-to-digital converting equipment further comprises:
a latch using an output of the first circuit as a data input, using an output of the second circuit as a clock input and outputting a signal to the subtractor.

11. The PLL circuit according to claim 9,
wherein the phase detecting or frequency detecting and time-to-digital converting equipment further comprises:
a latch using an output of the second circuit as a data input, using an output of the first circuit as a clock input and outputting a signal to the subtractor.

12. The PLL circuit according to claim 10,
wherein the phase detecting or frequency detecting and time-to-digital converting equipment comprises:
a function of digitally expressing a time of $2\pi$ corresponding to 1 clock by holding a phase by the latch once and then obtaining a difference between held data and a signal inputted next.

13. The PLL circuit according to claim 10,
wherein the phase detecting or frequency detecting and time-to-digital converting equipment comprises:
a function of making judgment of a polarity of a phase and adding a digital value corresponding to $-2\pi$ according to the judgment.

14. The PLL circuit according to claim 10,
wherein the phase detecting or frequency detecting and time-to-digital converting equipment further comprises:
a frequency judgment circuit; and
a function of responding when a frequency displaces largely.

15. The PLL circuit according to claim 11,
wherein the phase detecting or frequency detecting and time-to-digital converting equipment comprises:
a function of digitally expressing a time of $2\pi$ corresponding to 1 clock by holding a phase by the latch once and then obtaining a difference between held data and a signal inputted next.

16. The PLL circuit according to claim 11,
wherein the phase detecting or frequency detecting and time-to-digital converting equipment comprises:
a function of making judgment of a polarity of a phase and adding a digital value corresponding to $-2\pi$ according to the judgment.

17. The PLL circuit according to claim 11,
wherein the phase detecting or frequency detecting and time-to-digital converting equipment further comprises:
a frequency judgment circuit; and
a function of responding when a frequency displaces largely.

\* \* \* \* \*